United States Patent
Hsieh et al.

(10) Patent No.: US 12,166,048 B2
(45) Date of Patent: Dec. 10, 2024

(54) PIXEL ARRAY INCLUDING OCTAGON PIXEL SENSORS

(71) Applicant: Taiwan Semiconductor Manufacturing Company, Ltd., Hsinchu (TW)

(72) Inventors: Feng-Chien Hsieh, Pingtung (TW); Yun-Wei Cheng, Taipei (TW); Kuo-Cheng Lee, Tainan (TW); Cheng-Ming Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/308,014

(22) Filed: Apr. 27, 2023

(65) Prior Publication Data

US 2024/0079422 A1 Mar. 7, 2024

Related U.S. Application Data

(62) Division of application No. 16/949,766, filed on Nov. 13, 2020, now Pat. No. 11,670,651.

(51) Int. Cl.
*H01L 27/146* (2006.01)
*H04N 5/33* (2023.01)
(Continued)

(52) U.S. Cl.
CPC .. *H01L 27/14607* (2013.01); *H01L 27/14645* (2013.01); *H01L 27/14649* (2013.01);
(Continued)

(58) Field of Classification Search
CPC ......... H01L 27/14607; H01L 27/14645; H01L 27/14649; H01L 27/14685;
(Continued)

(56) References Cited

U.S. PATENT DOCUMENTS

2015/0084144 A1 3/2015 Suzuki et al.
2016/0150199 A1 5/2016 Wu et al.
(Continued)

FOREIGN PATENT DOCUMENTS

| CN | 108257985 A | * 7/2018 | ............ G01J 1/4257 |
| CN | 112310285 A | * 2/2021 | ....... H01L 27/14601 |
| KR | 20220001702 A | 1/2022 | |

*Primary Examiner* — Tracy Y. Li
(74) *Attorney, Agent, or Firm* — Harrity & Harrity, LLP

(57) ABSTRACT

A pixel array includes octagon-shaped pixel sensors and a combination of visible light pixel sensors (e.g., red, green, and blue pixel sensors) and near infrared (NIR) pixel sensors. The color information obtained by the visible light pixel sensors and the luminance obtained by the NIR pixel sensors may be combined to increase the low-light performance of the pixel array, and to allow for low-light color images in low-light applications. The octagon-shaped pixel sensors may be interspersed in the pixel array with square-shaped pixel sensors to increase the utilization of space in the pixel array, and to allow for pixel sensors in the pixel array to be sized differently. The capability to accommodate different sizes of visible light pixel sensors and NIR pixel sensors permits the pixel array to be formed and/or configured to satisfy various performance parameters.

20 Claims, 32 Drawing Sheets

(51) Int. Cl.
  *H04N 23/10* (2023.01)
  *H04N 25/76* (2023.01)
(52) U.S. Cl.
  CPC ......... *H01L 27/14685* (2013.01); *H04N 5/33* (2013.01); *H04N 23/10* (2023.01); *H04N 25/76* (2023.01); *H01L 27/14621* (2013.01); *H01L 27/14627* (2013.01); *H01L 27/1463* (2013.01)
(58) Field of Classification Search
  CPC ......... H01L 27/14621; H01L 27/14627; H01L 27/1463; H04N 5/33; H04N 23/10; H04N 25/76
  See application file for complete search history.

(56) References Cited

U.S. PATENT DOCUMENTS

| | | | |
|---|---|---|---|
| 2018/0006072 A1* | 1/2018 | Roy | H01L 27/14629 |
| 2018/0007324 A1 | 1/2018 | Chen et al. | |
| 2018/0182806 A1* | 6/2018 | Jin | H01L 27/14627 |
| 2018/0277580 A1* | 9/2018 | Chiang | H01L 27/14645 |
| 2018/0337211 A1* | 11/2018 | Su | H01L 27/1463 |
| 2019/0096930 A1* | 3/2019 | Chuang | H01L 27/1461 |
| 2019/0383725 A1 | 12/2019 | Petersen et al. | |
| 2020/0127037 A1* | 4/2020 | Kato | H01L 27/14649 |
| 2020/0273892 A1* | 8/2020 | Perkins | H01L 27/14629 |
| 2022/0052085 A1* | 2/2022 | Zang | H01L 27/14683 |
| 2022/0157869 A1 | 5/2022 | Hsieh et al. | |

* cited by examiner

PIXEL ARRAY INCLUDING OCTAGON PIXEL SENSORS

RELATED APPLICATION

This application is a divisional of U.S. patent application Ser. No. 16/949,766, filed Nov. 13, 2020, which is incorporated herein by reference in its entirety.

BACKGROUND

Complementary metal oxide semiconductor (CMOS) image sensors utilize light-sensitive CMOS circuitry, referred to as pixel sensors, to convert light energy into electrical energy. A pixel sensor typically includes a photodiode formed in a silicon substrate. As the photodiode is exposed to light, an electrical charge is induced in the photodiode. The photodiode may be coupled to a switching transistor, which is used to sample the charge of the photodiode. Colors may be determined by placing color filters over photodiodes of a CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
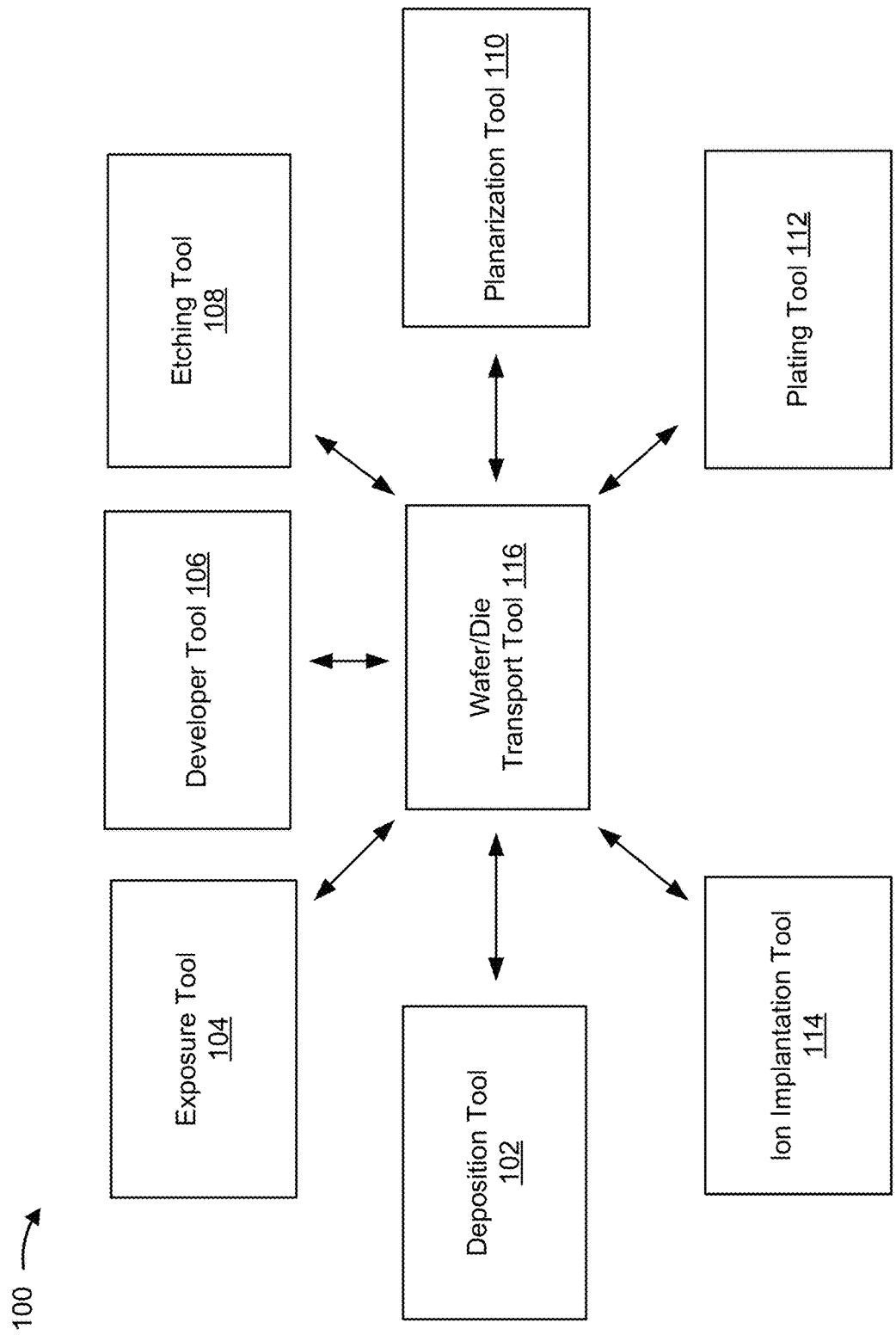
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a complementary metal oxide semiconductor (CMOS) image sensor, incident light received by pixel sensors of the CMOS image sensor is often separated into the three primary colors of visible light: red, green, and blue (RGB). This type of CMOS image sensor may be referred to an RGB image sensor. In an RGB image sensor, respective pixel sensors that sense a particular color of visible light can be defined through the use of a color filter that passes a wavelength range of visible light for a particular color to pass into a photodiode. In low-light conditions (e.g., where the availability of visible light is scarce, such as low indoor lighting or at night), RGB image sensors may suffer from poor image quality (e.g., image noise, poor contrast, poor color saturation) because the pixel sensors are not able to capture an adequate amount of red, green, and blue color luminance.

Some implementations described herein provide techniques and apparatuses for a pixel array that includes octagon-shaped pixel sensors. Moreover, the pixel array may include a combination of visible light pixel sensors (e.g., red, green, and blue pixel sensors) to obtain color information from incident light, and near infrared (NIR) pixel sensors to obtain an increased amount of luminance of the incident light relative to the visible light pixel sensors. The color information obtained by the visible light pixel sensors and the luminance obtained by the NIR pixel sensors may be combined to increase the low-light performance of the pixel array, and to allow for low-light color images in applications such as night-vision cameras, security surveillance cameras, automotive vision sensors, and hunting cameras. The octagon-shaped pixel sensors may be interspersed in the pixel array with square-shaped pixel sensors to increase the utilization of space in the pixel array, and to allow for pixel sensors in the pixel array to be sized differently. The capability to accommodate different sizes of visible light pixel sensors and NIR pixel sensors permits the pixel array to be formed and/or configured to satisfy various performance parameters, such as color saturation, noise, contrast, brightness, hue and saturation, light sensitivity, and contour sharpness.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etching tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etching tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a polishing device may include a chemical mechanical polishing (CMP) device and/or another type of polishing device. In some implementations, a polishing device may polish or planarize a layer of deposited or plated material.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is used to implant ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 116 includes a mobile robot, a robot arm, a tram or rail car, and/or another type of device that are used to transport wafers and/or dies between semiconductor processing tools 102-114 and/or to and from other locations such as a wafer rack, a storage room, and/or the like. In some implementations, wafer/die transport tool 116 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
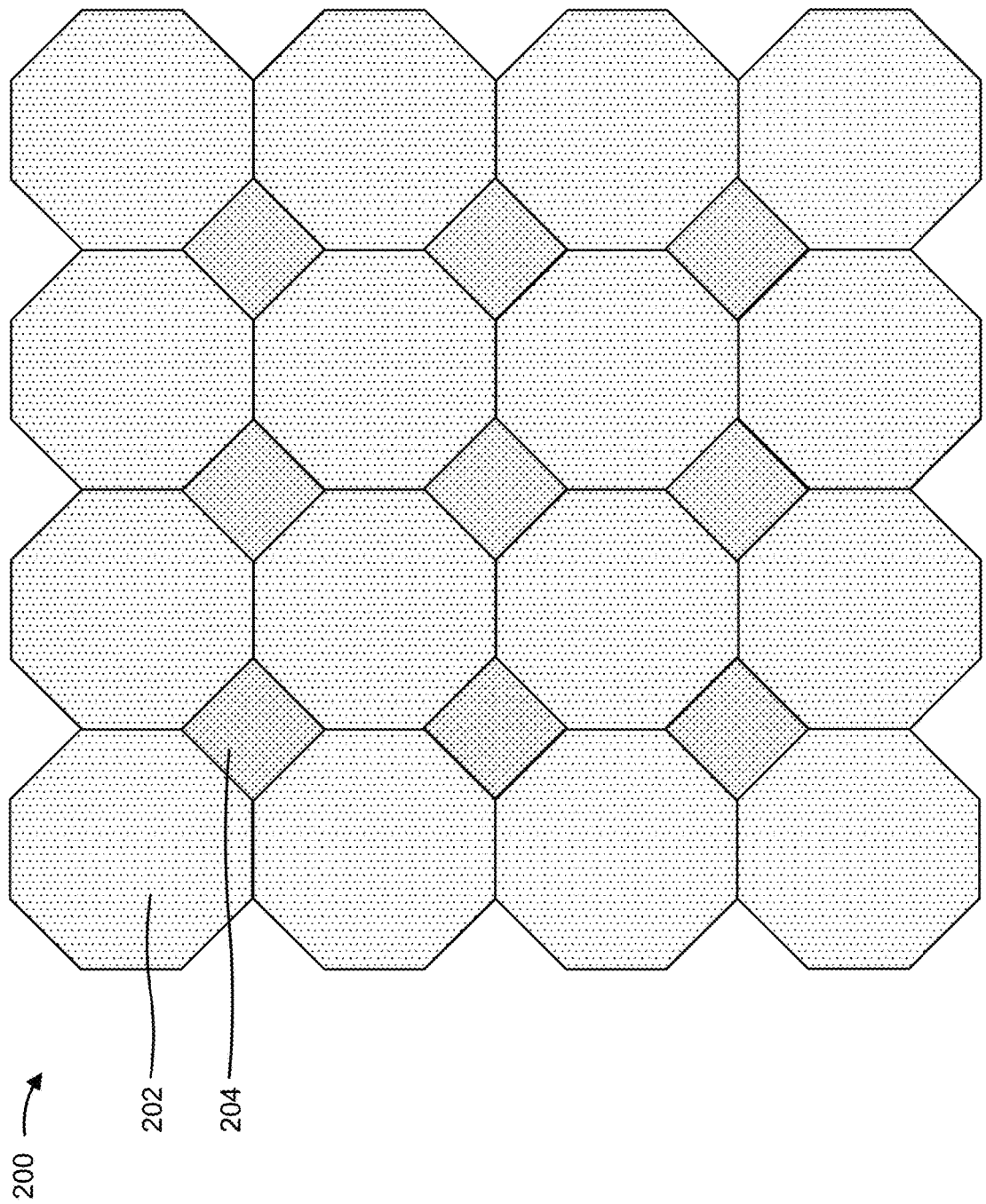
FIG. 2 is a diagram of an example pixel array described herein.

FIG. 2 is a diagram of an example pixel array 200 described herein. In some implementations, the pixel array 200 may be included in an image sensor. The image sensor may be a CMOS image sensor, a backside illumination (BSI) CMOS image sensor, or another type of image sensor. As shown in FIG. 2, the pixel array 200 may include a plurality of octagon-shaped pixel sensors 202 and a plurality of square-shaped pixel sensors 204. The octagon-shaped pixel sensors 202 and the square-shaped pixel sensors 204 may be interspersed, intermixed, and/or distributed throughout the pixel array 200.

As shown in FIG. 2, a square-shaped pixel sensor 204 may be disposed between and/or surrounded by a subset of octagon-shaped pixel sensors 202 (e.g., 4 octagon-shaped pixel sensors 202) such that the sides of the octagon-shaped pixel sensors 202 align with the sides of the square-shaped pixel sensors 204. This reduces and/or minimizes unused gaps or portions between the pixel sensors of the pixel array 200, which increases the pixel sensor density of the pixel array 200 and increases spatial utilization in the pixel array 200.

Moreover, this particular arrangement permits the length of the sides of the octagon-shaped pixel sensors 202 to be adjusted to increase or decrease the size of the square-shaped pixel sensors 204 while maintaining the tight grouping of pixel sensors in the pixel array 200. For example, the length of the sides of octagon-shaped pixel sensors 202 facing a square-shaped pixel sensor 204 may be decreased to correspondingly decrease the size of the square-shaped pixel sensor 204. As another example, the length of the sides of octagon-shaped pixel sensors 202 facing a square-shaped pixel sensor 204 may be increased to correspondingly increase the size of the square-shaped pixel sensor 204. In addition, this particular arrangement permits the square-shaped pixel sensors 204 to be used with regular octagon-shaped pixel sensors (e.g., octagon-shaped pixel sensors having all sides the same length) and/or irregular octagon-shaped pixel sensors (e.g., octagon-shaped pixel sensors having two or more sides of different lengths).

As indicated above, FIG. 2 is provided as an example. Other examples may differ from what is described with regard to FIG. 2.

Figure 3A:
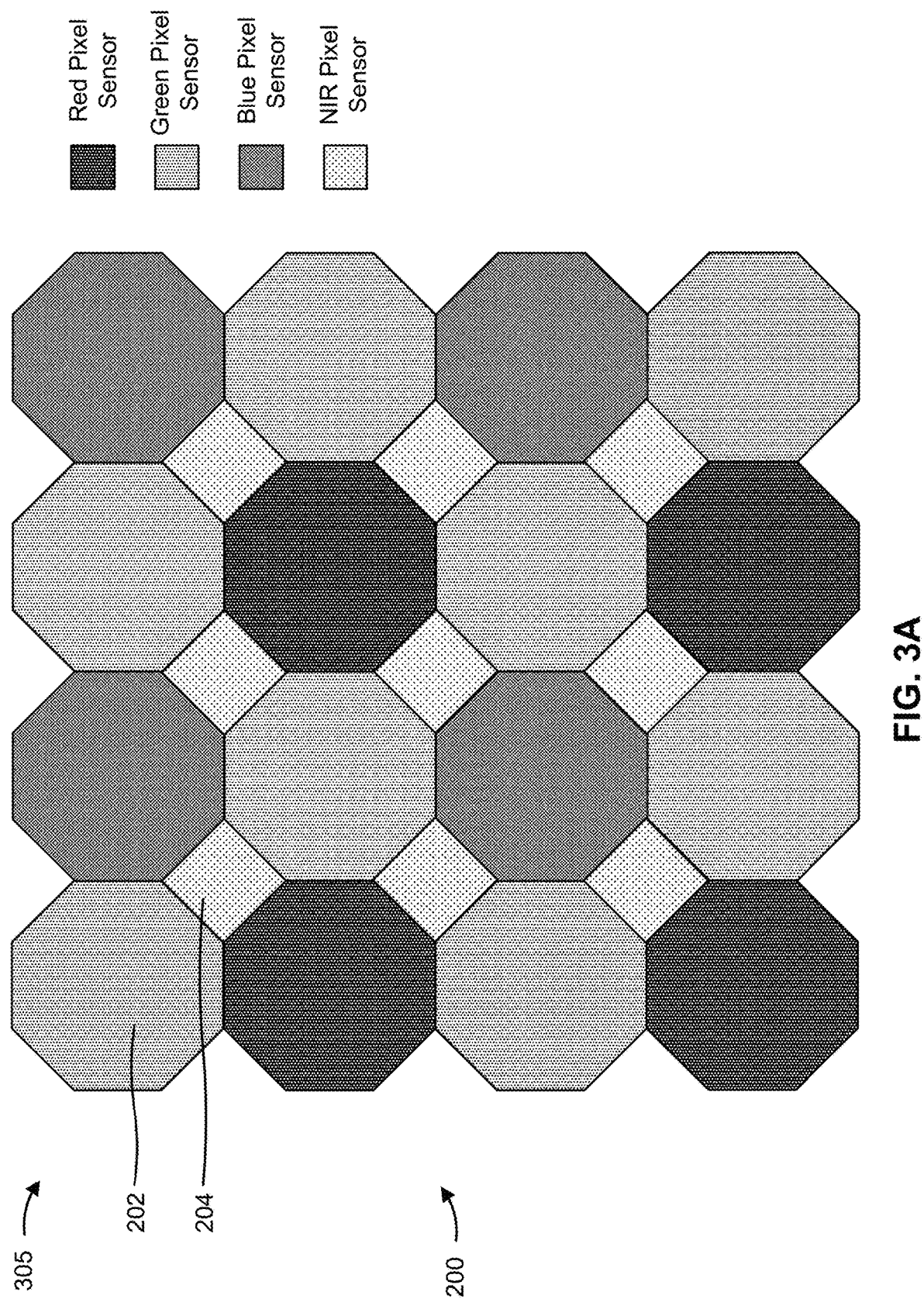
FIGS. 3A and 3B, 4A-4F, and 5A-5D are diagrams of example pixel sensor configurations described herein.
Figure 3B:
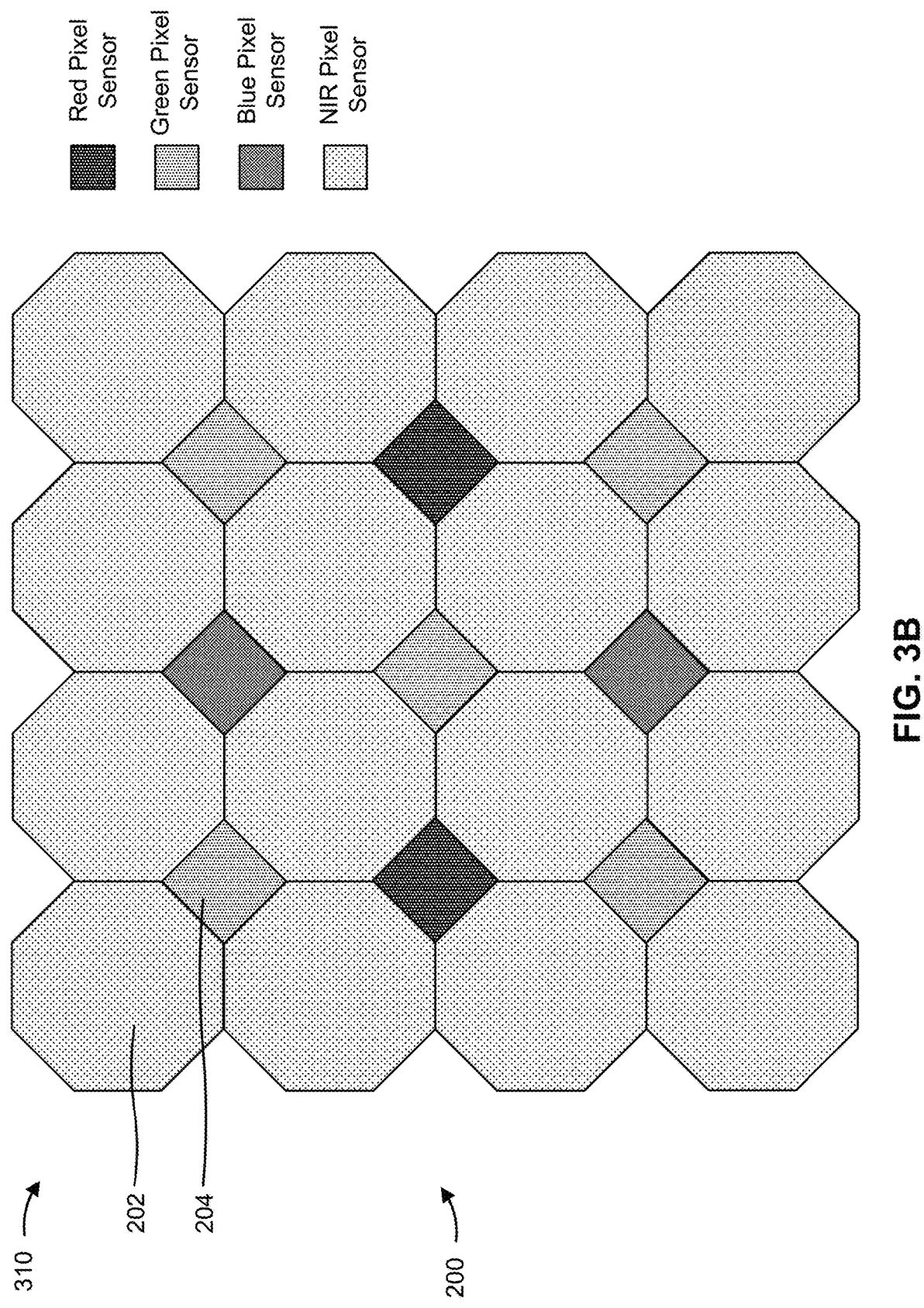

FIGS. 3A and 3B are diagrams of example pixel sensor configurations described herein. In some implementations, the example pixel sensor configurations illustrated in FIGS. 3A and 3B are example pixel sensor configurations for the pixel array 200 and/or other pixel arrays. Other pixel sensor configurations, similar to the example pixel sensor configurations illustrated in FIGS. 3A and 3B, may be used for the pixel array 200 and/or other pixel arrays.

As shown in FIGS. 3A and 3B, the pixel array 200 may be configured to include a plurality of visible light pixel sensors and a plurality of NIR pixel sensors. Each visible light pixel sensor may be formed and/or configured to sense a wavelength of incident light associated with a particular color of visible light. For example, a red light pixel sensor may be a visible light pixel sensor that is formed and/or configured to sense a wavelength range of incident light corresponding to a red component of visible light (e.g., to provide red color information for the incident light), a green light pixel sensor may be a visible light pixel sensor that is formed and/or configured to sense a wavelength range of incident light corresponding to a green component of visible light (e.g., to provide green color information for the incident light), and a blue light pixel sensor may be a visible light pixel sensor that is formed and/or configured to sense a wavelength range of incident light corresponding to a blue component of visible light (e.g., to provide blue color information for the incident light). Each NIR pixel sensor may be formed and/or configured to sense a wavelength of incident light associated with a wavelength of non-visible infrared light near the wavelength range of visible light. For example, an NIR pixel sensor may be formed and/or configured to sense a wavelength range of incident light in a range of approximately 700 nanometers to approximately 1400 nanometers.

The visible light pixel sensors of the pixel array 200 may be used to sense and obtain color information (e.g., color saturation information, color intensity information, color distribution information, and/or other types of color information) for incident light directed toward the pixel array 200. The electromagnetic radiation emitted by the sun includes a greater amount of infrared light than visible light, and the infrared light emitted by the sun is primarily composed of NIR light. Accordingly, the NIR pixel sensors of the pixel array 200 may be capable of sensing and obtaining a greater amount of luminance information for incident light relative to the visible light pixel sensors. In this way, the NIR pixel sensors of the pixel array 200 may be used to increase the light sensitivity of the pixel array, increase the contour sharpness of images generated by the image sensor, and increase the low-light performance of the image sensor.

FIG. 3A illustrates an example 305 in which the octagon-shaped pixel sensors 202 of the pixel array 200 are configured as visible light pixel sensors (e.g., red pixel sensors, green pixel sensors, and blue pixel sensors), and the square-shaped pixel sensors 204 of the pixel array 200 are configured as NIR light pixel sensors. FIG. 3B illustrates an example 310 in which the octagon-shaped pixel sensors 202 of the pixel array 200 are configured as NIR light pixel sensors, and the square-shaped pixel sensors are configured as visible light pixel sensors (e.g., red pixel sensors, green pixel sensors, and blue pixel sensors). The configuration and quantity of NIR light pixel sensors and the configuration and quantity of visible light pixel sensors in the pixel array 200 may be selected to achieve or satisfy one or more performance parameters for the image sensor, such as color saturation, noise, contrast, brightness, hue and saturation, light sensitivity, and/or contour sharpness. As an example, the pixel array 200 may be configured according to example 305 (e.g., such that the octagon-shaped pixel sensors 202 of the pixel array 200 are configured as visible light pixel sensors and the square-shaped pixel sensors 204 of the pixel array 200 are configured as NIR light pixel sensors) to achieve increased color saturation for the image sensor. As an example, the pixel array 200 may be configured according to example 310 (e.g., such that the octagon-shaped pixel sensors 202 of the pixel array 200 are configured as NIR light pixel sensors and the square-shaped pixel sensors 204 of the pixel array 200 are configured as visible light pixel sensors) to achieve increased low-light performance and/or to achieve increase contour sharpness.

As indicated above, FIGS. 3A and 3B are provided as examples. Other examples may differ from what is described with regard to FIGS. 3A and 3B. The configuration of the octagon-pixel sensors 202 and/or the configuration of the square-shaped pixel sensors 204 described above in connection with FIGS. 3A and 3B may be arranged according to the examples described above and/or arranged according to other examples to achieve or satisfy one or more performance parameters and/or attributes, such as color saturation, noise, contrast, brightness, hue and saturation, light sensitivity, contour sharpness, image sensor size, pixel sensor density, and/or the like.

FIGS. 4A-4F are diagrams of example pixel sensor configurations described herein. In particular, FIGS. 4A-4F illustrate example size and/or orientation configurations for a plurality of octagon-shaped pixel sensors 202 and a square-shaped pixel sensor 204. The example pixel sensor configurations illustrated in FIGS. 4A-4F (and similar pixel sensor configurations) may be applied to a pixel array (e.g., the pixel array 200) or a portion thereof.

Figure 4A:
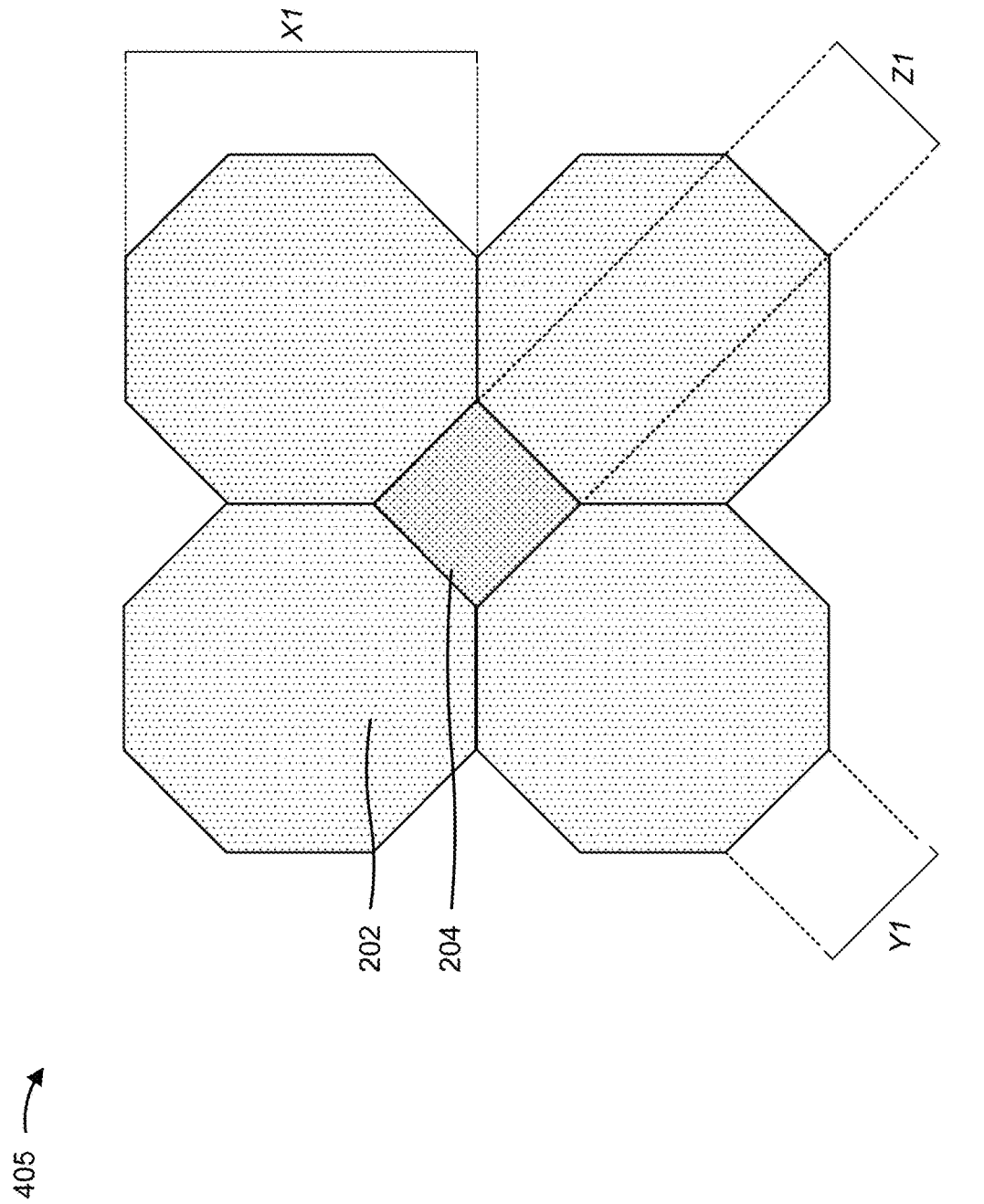

As shown in FIGS. 4A-4F, each octagon-shaped pixel sensor 202 may have various attributes such as one or more side lengths and a width. Moreover, each square-shaped pixel sensor 204 may have various attributes such as a side length (which may correspond to a width of each square-shaped pixel sensor 204). FIG. 4A illustrates an example 405 including a plurality of regular octagon-shaped pixel sensors 202 (e.g., each octagon-shaped pixel sensor 202 has equilateral sides). As shown in FIG. 4A, each octagon-shaped pixel sensor 202 may have a width X1 and a side length Y1. An example range for the width X1 may include approximately 0.5 microns to approximately 20 microns, which based on process capability at the low end of the range and based on process uniformity at the high end of the range. An example range for the side length Y1 may include approximately 0.15 microns to approximately 8 microns, which may be based on the approximately 0.5 microns to approximately 20 microns range. As further shown in FIG. 4A, the square-shaped pixel sensor 204 may have a side length or width Z1 in a range of approximately 0.15 microns to approximately 8 microns, which may be based on the approximately 0.5 microns to approximately 20 microns range and based on the side length Y1. The above-described ranges for the dimensions X1, Y1, and Z1 enable the size of the octagon-shaped pixel sensors 202 to be moderately larger than the size of the square-shaped pixel sensors 204. In some implementations, the side length Y1 of the octagon-shaped pixel sensors 202 and the side length or width Z1 of the square-shaped pixel sensor 204 are the same size to reduce and/or minimize the unused gaps or portions between the square-shaped pixel sensor 204 and the octagon-shaped pixel sensors 202.

Figure 4B:
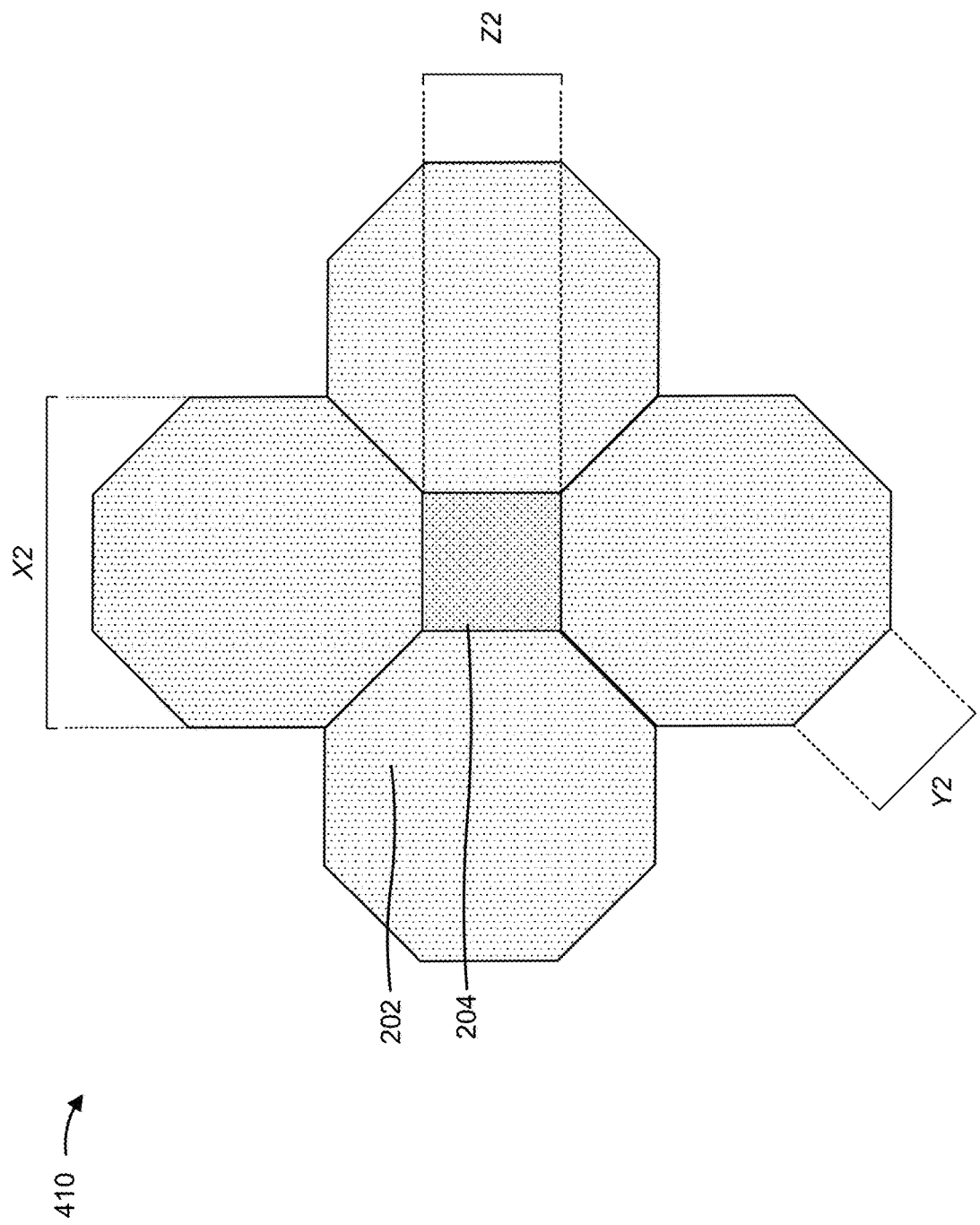

FIG. 4B illustrates an example 410 including a plurality of regular octagon-shaped pixel sensors 202 (e.g., each octagon-shaped pixel sensor 202 has equilateral sides). As shown in FIG. 4B, each octagon-shaped pixel sensor 202 may have a width X2 and a side length Y2, and the square-shaped pixel sensor 204 may have a side length or width Z2. The dimensional ranges of X2, Y2, and Z2 may be similar to the dimensional ranges of X1, Y1, and Z1, respectively to enable the size of the octagon-shaped pixel sensors 202 to be moderately larger than the size of the square-shaped pixel sensors 204. However, the octagon-shaped pixel sensors 202 and the square-shaped pixel sensor 204 in the example 410 may be oriented differently relative to the octagon-shaped pixel sensors 202 and the square-shaped pixel sensor 204 in the example 405. In particular, the octagon-shaped pixel sensors 202 and the square-shaped pixel sensor 204 in the example 410 are rotated 45 degrees relative to the octagon-shaped pixel sensors 202 and the square-shaped pixel sensor 204 in the example 405.

Figure 4C:
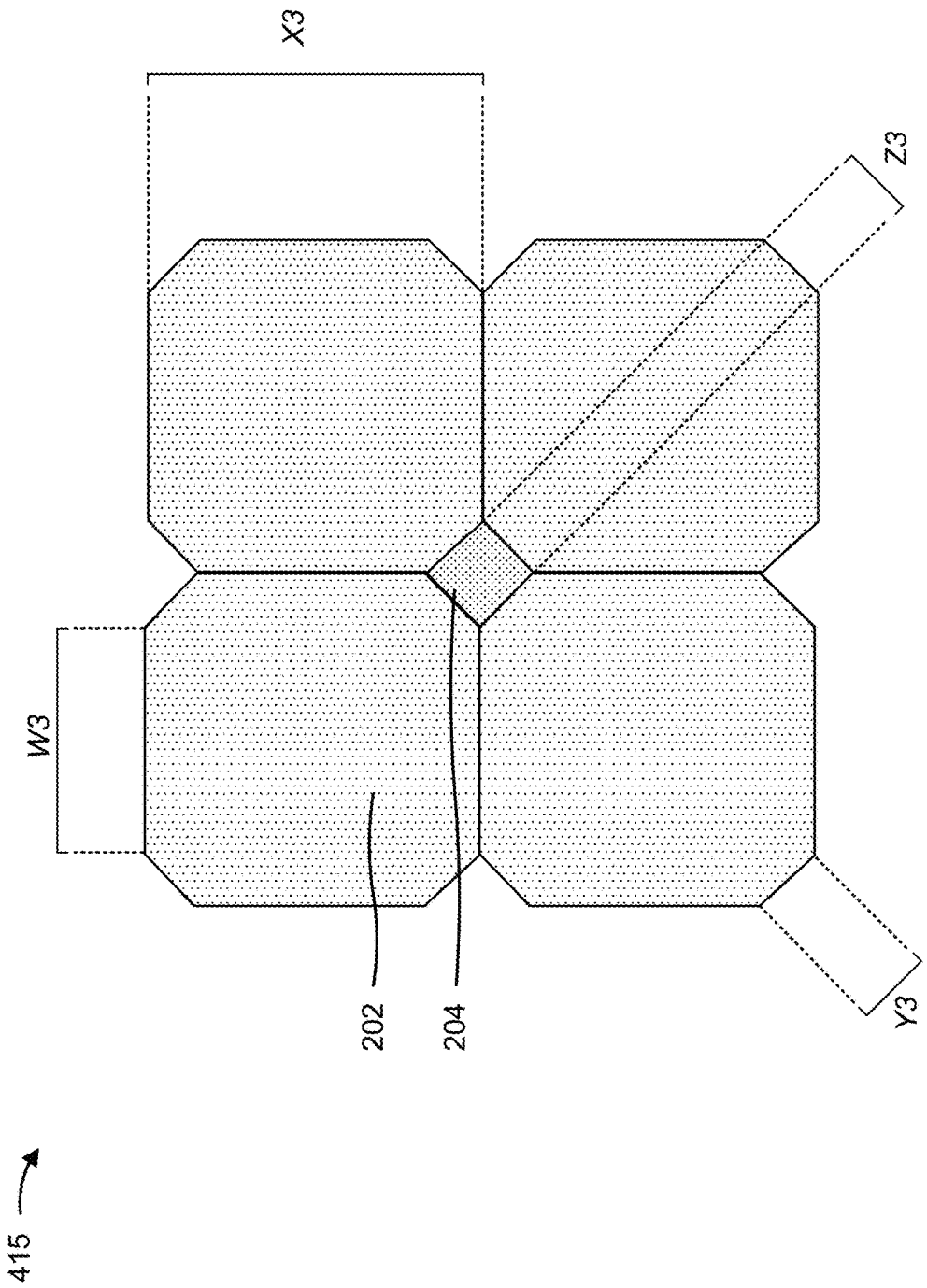

FIG. 4C illustrates an example 415 including a plurality of irregular octagon-shaped pixel sensors 202 (e.g., each octagon-shaped pixel sensor 202 has two or more sides with different lengths). As shown in FIG. 4C, each octagon-shaped pixel sensor 202 may have a width X3, side length Y3, and a side length W3. An example range for the width X3 may include approximately 0.37 microns to approximately 19.76 microns, which based on process capability at the low end of the range and based on process uniformity at the high end of the range. An example range for the side length Y3 may include approximately 0.05 microns to approximately 2.67 microns, which may be based on the approximately 0.37 microns to approximately 19.76 microns range. An example range for the side length W3 may include approximately 0.3 microns to approximately 16 microns, which may be based on the approximately 0.37 microns to approximately 19.76 microns range and based on the side length Y3. As further shown in FIG. 4C, the square-shaped pixel sensor 204 may have a side length or width Z3 in a range of approximately 0.05 microns to approximately 2.67 microns, which may be based on the approximately 0.37 microns to approximately 19.76 microns range and based on the side length Y3. The above-described ranges for the dimensions X3, Y3, W3, and Z3 enable the size of the octagon-shaped pixel sensors 202 to be greatly larger than the size of the square-shaped pixel sensors 204. In some implementations, the side length Y3 of the octagon-shaped pixel sensors 202 and the side length or width Z3 of the square-shaped pixel sensor 204 are the same size to reduce and/or minimize the gaps or portions between the square-shaped pixel sensor 204 and the octagon-shaped pixel sensors 202.

Figure 4D:
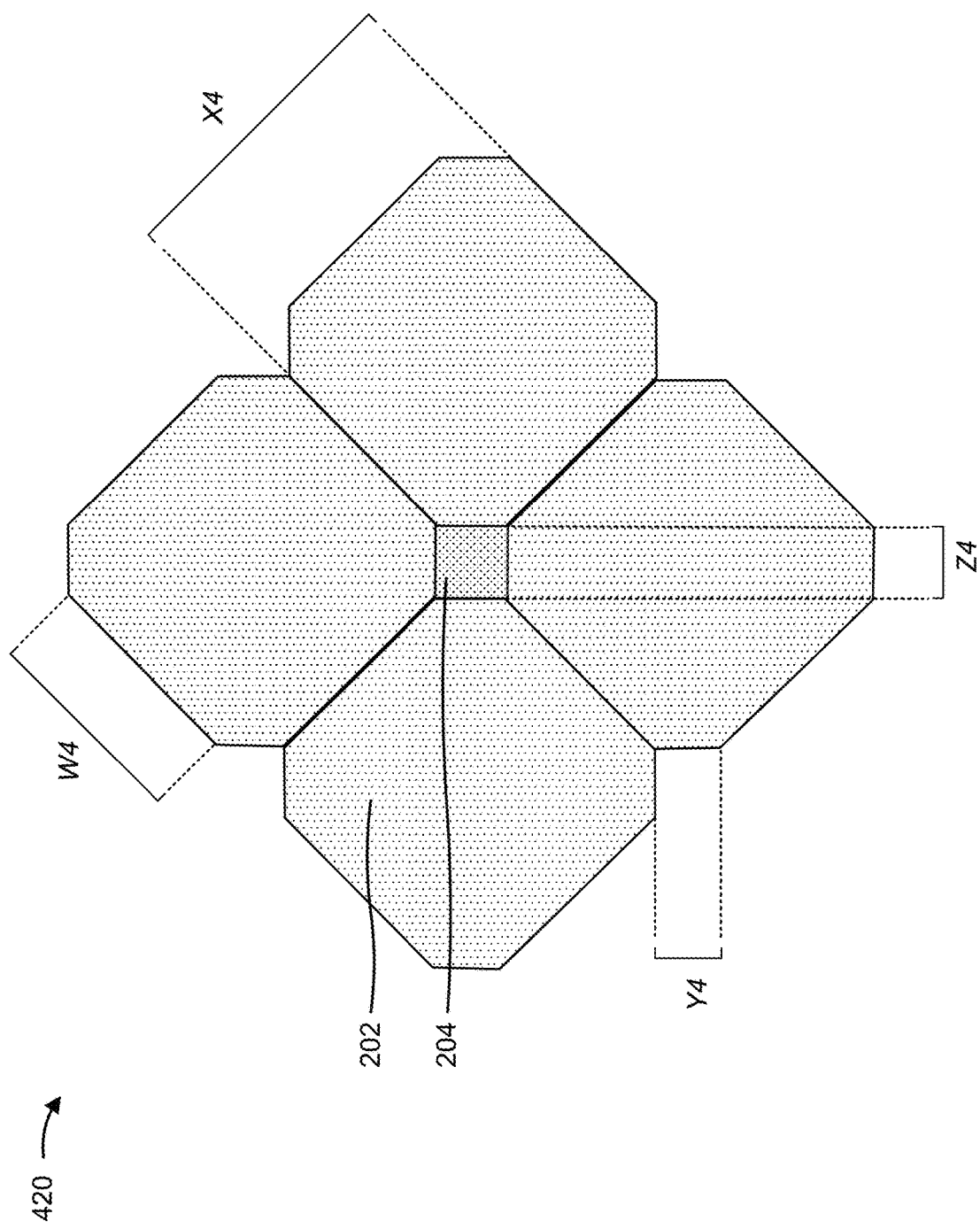

FIG. 4D illustrates an example 420 including a plurality of irregular octagon-shaped pixel sensors 202 (e.g., each octagon-shaped pixel sensor 202 has two or more sides with different lengths). As shown in FIG. 4D, each octagon-shaped pixel sensor 202 may have a width X4, a side length Y4, and another side length W4. The square-shaped pixel sensor 204 may have a side length or width Z4. The dimensional ranges of W4, X4, Y4, and Z4 may be similar to the dimensional ranges of W3, X3, Y3, and Z3, respectively to enable the size of the octagon-shaped pixel sensors 202 to be greatly larger than the size of the square-shaped pixel sensors 204. However, the octagon-shaped pixel sensors 202 and the square-shaped pixel sensor 204 in the example 420 may be oriented differently relative to the octagon-shaped pixel sensors 202 and the square-shaped pixel sensor 204 in the example 415. In particular, the octagon-shaped pixel sensors 202 and the square-shaped pixel sensor 204 in the example 420 are rotated 45 degrees relative to the octagon-shaped pixel sensors 202 and the square-shaped pixel sensor 204 in the example 415.

Figure 4E:
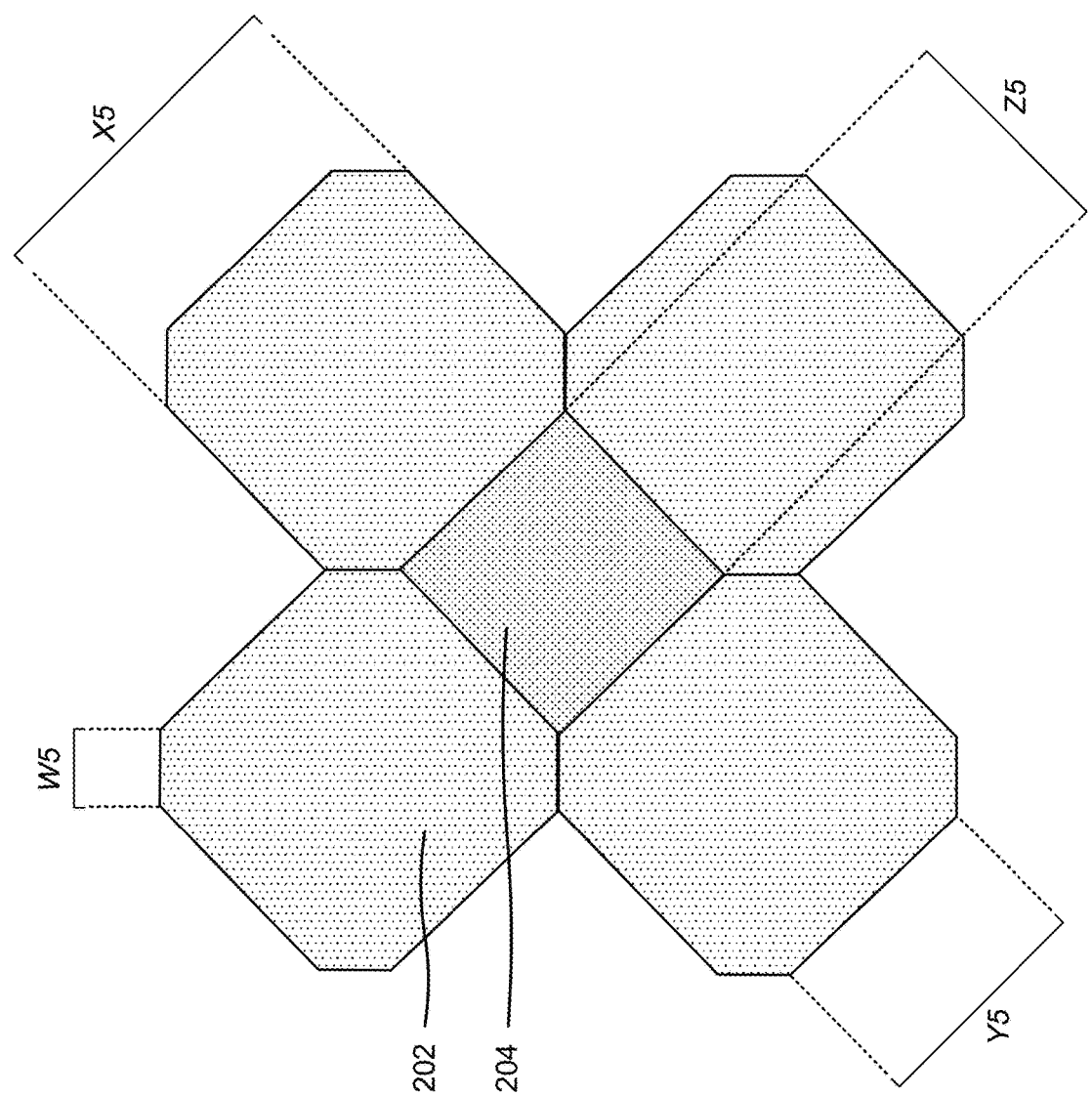

FIG. 4E illustrates an example 425 including a plurality of irregular octagon-shaped pixel sensors 202 (e.g., each octagon-shaped pixel sensor 202 has two or more sides with different lengths). As shown in FIG. 4E, each octagon-shaped pixel sensor 202 may have a width X5, side length Y5, and a side length W5. An example range for the width X5 may include approximately 0.25 microns to approximately 14 microns, which based on process capability at the low end of the range and based on process uniformity at the high end of the range. An example range for the side length Y5 may include approximately 0.2 microns to approximately 10.67 microns, which may be based on the approximately 0.25 microns to approximately 14 microns range. An example range for the side length W5 may include approximately 0.04 microns to approximately 2.29 microns, which may be based on the approximately 0.25 microns to approximately 14 microns range and the side length Y5. As further shown in FIG. 4E, the square-shaped pixel sensor 204 may have a side length or width Z5 in a range of approximately 0.2 microns to approximately 10.67 microns, which may be based on the approximately 0.025 microns to approximately 14 microns range and the side length Y5. The above-described ranges for the dimensions X5, Y5, W5, and Z5 enable the size of the octagon-shaped pixel sensors 202 to be slightly larger than the size of the square-shaped pixel sensors 204. In some implementations, the side length Y5 of the octagon-shaped pixel sensors 202 and the side length or width Z5 of the square-shaped pixel sensor 204 are the same size to reduce and/or minimize the unused gaps or portions between the square-shaped pixel sensor 204 and the octagon-shaped pixel sensors 202.

Figure 4F:
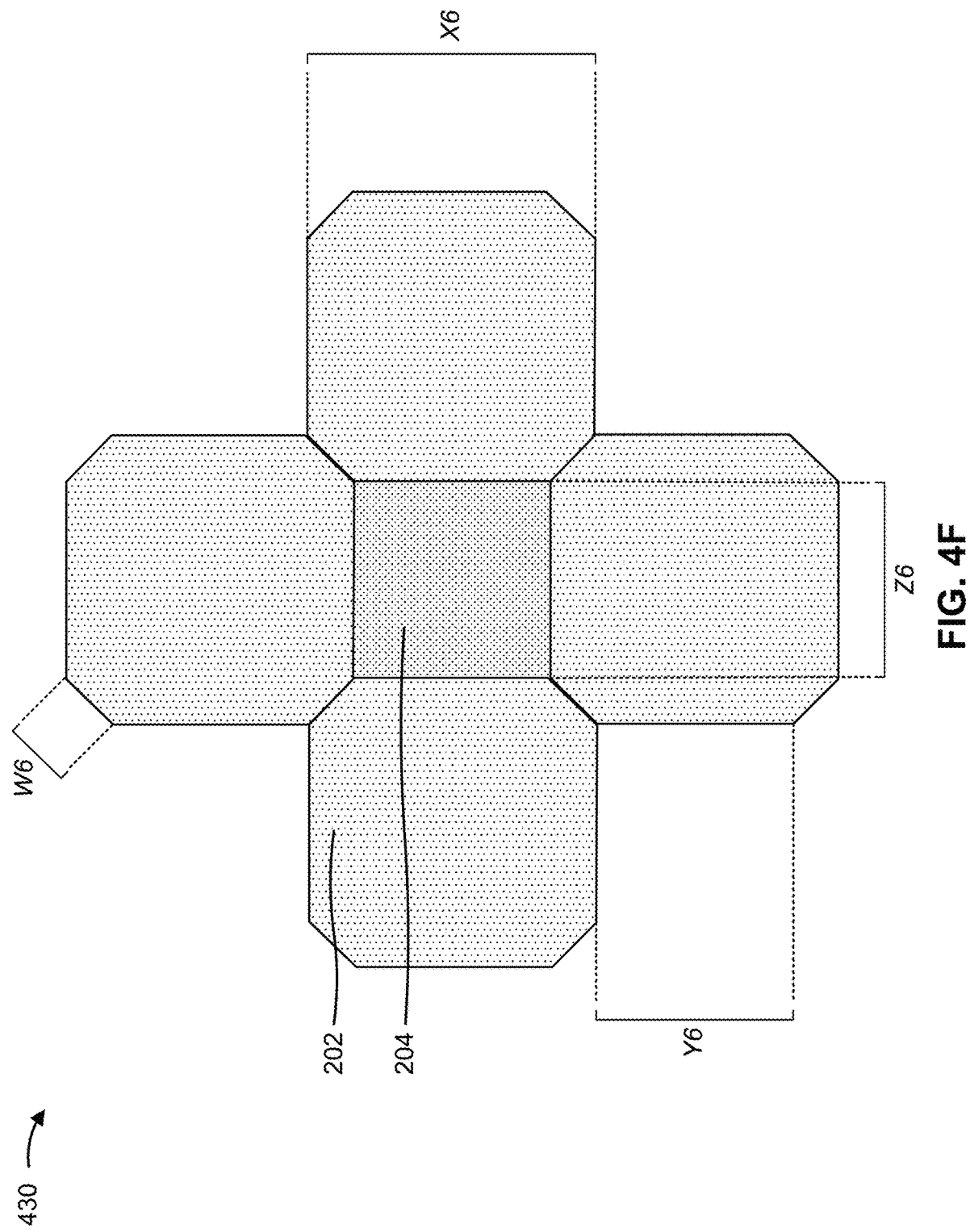

FIG. 4F illustrates an example 430 including a plurality of irregular octagon-shaped pixel sensors 202 (e.g., each octagon-shaped pixel sensor 202 has two or more sides with different lengths). As shown in FIG. 4F, each octagon-shaped pixel sensor 202 may have a width X6, a side length Y6, and another side length W6. The square-shaped pixel sensor 204 may have a side length or width Z6. The dimensional ranges of W6, X6, Y6, and Z6 may be similar to the dimensional ranges of W5, X5, Y5, and Z5, respectively to enable the size of the octagon-shaped pixel sensors 202 to be slightly larger than the size of the square-shaped pixel sensors 204. However, the octagon-shaped pixel sensors 202 and the square-shaped pixel sensor 204 in the example 430 may be oriented differently relative to the octagon-shaped pixel sensors 202 and the square-shaped pixel sensor 204 in the example 425. In particular, the octagon-shaped pixel sensors 202 and the square-shaped pixel sensor 204 in the example 430 are rotated 45 degrees relative to the octagon-shaped pixel sensors 202 and the square-shaped pixel sensor 204 in the example 425.

In some implementations, the ratio between the size or area of square-shaped pixel sensors 204 to the size or area of octagon-shaped pixel sensors 202 may range from approximately 1:80 to approximately 32:49. In some implementations, the size or area of a square-shaped pixel sensor 204 relative to the size or area of an octagon-shaped pixel sensors 202, as a percentage, may range from approximately 1.3% (e.g., the square-shaped pixel sensor 204 is 1.3% of the size or area of the octagon-shaped pixel sensor 202) to approximately 65.3% (e.g., the square-shaped pixel sensor 204 is 65.3% of the size or area of the octagon-shaped pixel sensor 202). The configuration of the octagon-shaped pixel sensors 202 and/or the configuration of the square-shaped pixel sensors 204 described above in connection with FIGS. 4A-4F may be arranged according to the examples described above and/or arranged according to other examples to achieve or satisfy one or more performance parameters and/or attributes, such as color saturation, noise, contrast, brightness, hue and saturation, light sensitivity, contour sharpness, image sensor size, pixel sensor density, and/or the like.

As an example, octagon-shaped pixel sensors 202 and square-shaped pixel sensors 204 may be arranged in the pixel array 200 according to the configurations shown in FIG. 4C or 4D to provide a greater difference in size and/or area between the octagon-shaped pixel sensors 202 and the square-shaped pixel sensors 204 (e.g., such that the ratio between the size or area of square-shaped pixel sensors 204 to the size or area of octagon-shaped pixel sensors 202 is near the lower end of the range from approximately 1:80 to approximately 32:49) while minimizing the amount of unused space between pixel sensors. In these configurations, the larger octagon-shaped pixel sensors 202 (or the majority the octagon-shaped pixel sensors 202) may be configured as NIR pixel sensors to greatly increase the low-light sensitivity and contour sharpness of the pixel array 200 while the smaller square-shaped pixel sensors 204 (or the majority of the square-shaped pixel sensors 204) may be configured as visible light pixel sensors to provide a relatively small amount of color compensation and color saturation for the pixel array 200. Alternatively, in these configurations, the larger octagon-shaped pixel sensors 202 (or the majority the octagon-shaped pixel sensors 202) may be configured as visible light pixel sensors to greatly increase the color compensation and color saturation of the pixel array 200 while the smaller square-shaped pixel sensors 204 (or the majority of the square-shaped pixel sensors 204) may be configured as NIR pixel sensors to provide a relatively small amount of low-light performance and contour sharpness increase for the pixel array 200.

As an example, octagon-shaped pixel sensors 202 and square-shaped pixel sensors 204 may be arranged in the pixel array 200 according to the configurations shown in FIG. 4A or 4B to provide a moderate difference in size and/or area between the octagon-shaped pixel sensors 202 and the square-shaped pixel sensors 204 (e.g., such that the ratio between the size or area of square-shaped pixel sensors 204 to the size or area of octagon-shaped pixel sensors 202 is near the middle of the range from approximately 1:80 to approximately 32:49) while minimizing the amount of unused space between pixel sensors. In these configurations, the moderately larger octagon-shaped pixel sensors 202 (or the majority the octagon-shaped pixel sensors 202) may be configured as NIR pixel sensors to provide a moderate increase in the low-light sensitivity and contour sharpness of the pixel array 200 while the moderately smaller square-shaped pixel sensors 204 (or the majority of the square-shaped pixel sensors 204) may be configured as visible light pixel sensors to provide a relatively moderate color compensation and color saturation for the pixel array 200. Alternatively, in these configurations, the moderately larger octagon-shaped pixel sensors 202 (or the majority the octa-gon-shaped pixel sensors 202) may be configured as visible light pixel sensors to greatly increase the color performance of the pixel array 200 while the moderately smaller square-shaped pixel sensors 204 (or the majority of the square-shaped pixel sensors 204) may be configured as NIR pixel sensors to provide a relatively smaller amount of low-light performance increase for the pixel array 200.

As an example, octagon-shaped pixel sensors 202 and square-shaped pixel sensors 204 may be arranged in the pixel array 200 according to the configurations shown in FIG. 4E or 4F to provide a small difference in size and/or area between the octagon-shaped pixel sensors 202 and the square-shaped pixel sensors 204 (e.g., such that the ratio between the size or area of square-shaped pixel sensors 204 to the size or area of octagon-shaped pixel sensors 202 is near the upper end of the range from approximately 1:80 to approximately 32:49) while minimizing the amount of unused space between pixel sensors. In these configurations, the slightly larger octagon-shaped pixel sensors 202 (or the majority the octagon-shaped pixel sensors 202) may be configured as NIR pixel sensors to provide a small increase in the low-light sensitivity and contour performance of the pixel array 200 while the slightly square-shaped pixel sensors 204 (or the majority of the square-shaped pixel sensors 204) may be configured as visible light pixel sensors to provide strong color compensation and color saturation for the pixel array 200. Alternatively, in these configurations, the slightly larger octagon-shaped pixel sensors 202 (or the majority the octagon-shaped pixel sensors 202) may be configured as visible light pixel sensors to provide a small increase in the color performance and the color saturation of the pixel array 200 while the slightly smaller square-shaped pixel sensors 204 (or the majority of the square-shaped pixel sensors 204) may be configured as NIR pixel sensors to provide strong low-light performance and contour sharpness for the pixel array 200.

As indicated above, FIGS. 4A-4F are provided as examples. Other examples may differ from what is described with regard to FIGS. 4A-4F.

FIGS. 5A-5D are diagrams of example pixel sensor configurations described herein. In particular, FIGS. 5A-5D illustrate example arrangement configurations for a plurality of octagon-shaped pixel sensors 202 and a plurality of square-shaped pixel sensors 204. The example pixel sensor configurations illustrated in FIGS. 5A-5D (and similar pixel sensor configurations) may be applied to a pixel array (e.g., the pixel array 200) or a portion thereof.

Figure 5A:
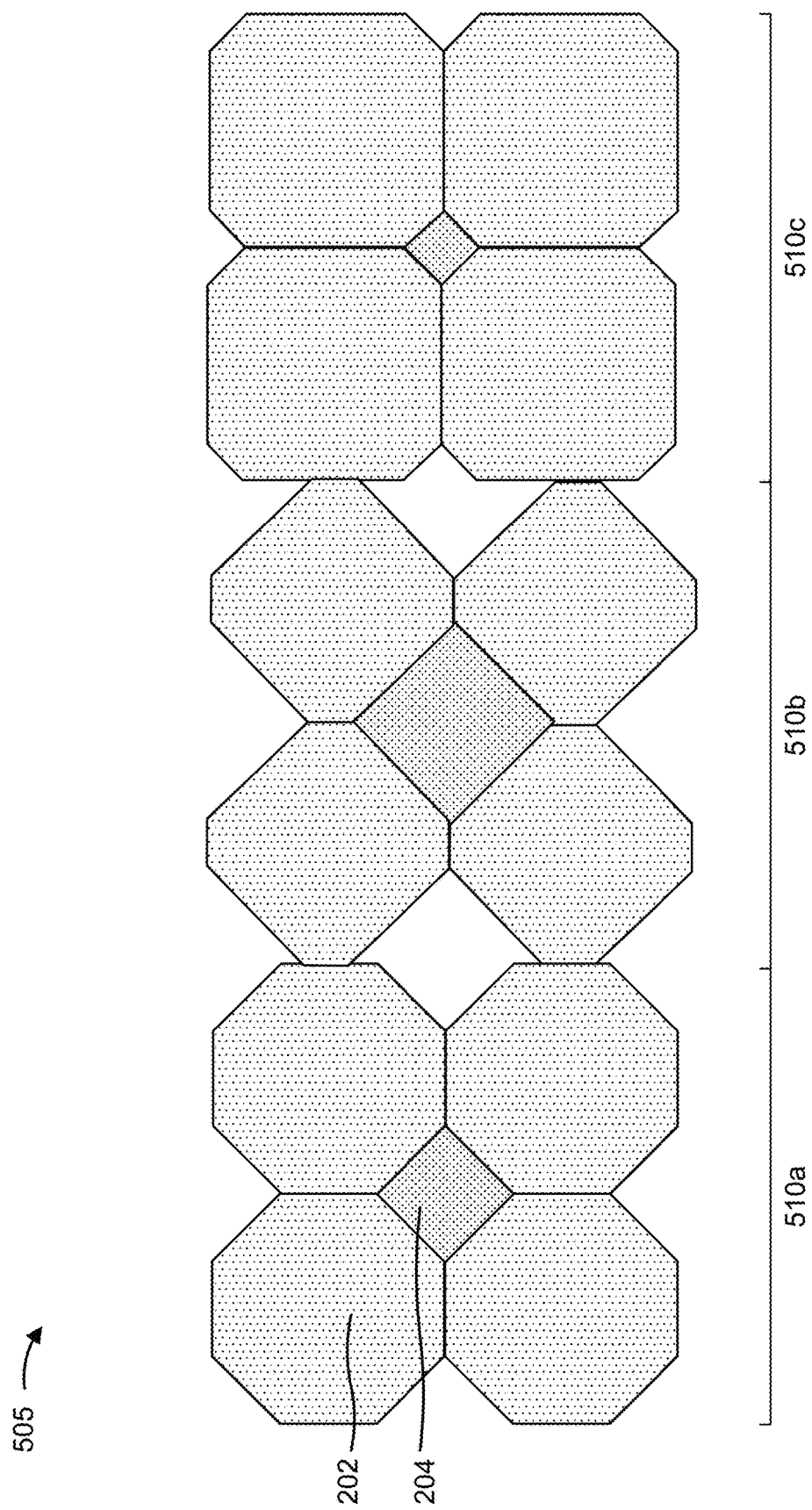

FIG. 5A illustrates an example 505 in which a pixel array includes a plurality of non-overlapping regions 510 of pixel sensor configurations. For example, region 510a of the pixel array may include a plurality of regular octagon-shaped pixel sensors 202 and one or more square-shaped pixel sensors 204. As another example, a region 510b of the pixel array may include a plurality of irregular octagon-shaped pixel sensors 202 and one or more square-shaped pixel sensors 204. As another example, a region 510c of the pixel array may include a plurality of irregular octagon-shaped pixel sensors 202 and one or more square-shaped pixel sensors 204.

Some attributes of the pixel sensor configurations in the different regions 510 may be different. For example, the size ratio or percentage between the octagon-shaped pixel sensors 202 and the square-shaped pixel sensor 204 in region 510a, the size ratio or percentage between the octagon-shaped pixel sensors 202 and the square-shaped pixel sensor 204 in region 510b, and the size ratio or percentage between the octagon-shaped pixel sensors 202 and the square-shaped pixel sensor 204 in region 510c may be different size ratios or different percentages. As another example, the sizes (e.g., side length(s) and/or widths) of the octagon-shaped pixel sensors 202 may be different in regions 510a, 510b, and 510c, and the sizes (e.g., side length(s) or widths) of the square-shaped pixel sensors 204 may be different in regions 510a, 510b, and 510c.

Some attributes of the pixel sensor configurations in the different regions 510 may be the same. For example, the octagon-shaped pixel sensors 202 and the square-shaped pixel sensor 204 in region 510a, the octagon-shaped pixel sensors 202 and the square-shaped pixel sensor 204 in region 510b, and the octagon-shaped pixel sensors 202 and the square-shaped pixel sensor 204 in region 510c, may all be rotated in the same orientation.

Figure 5B:
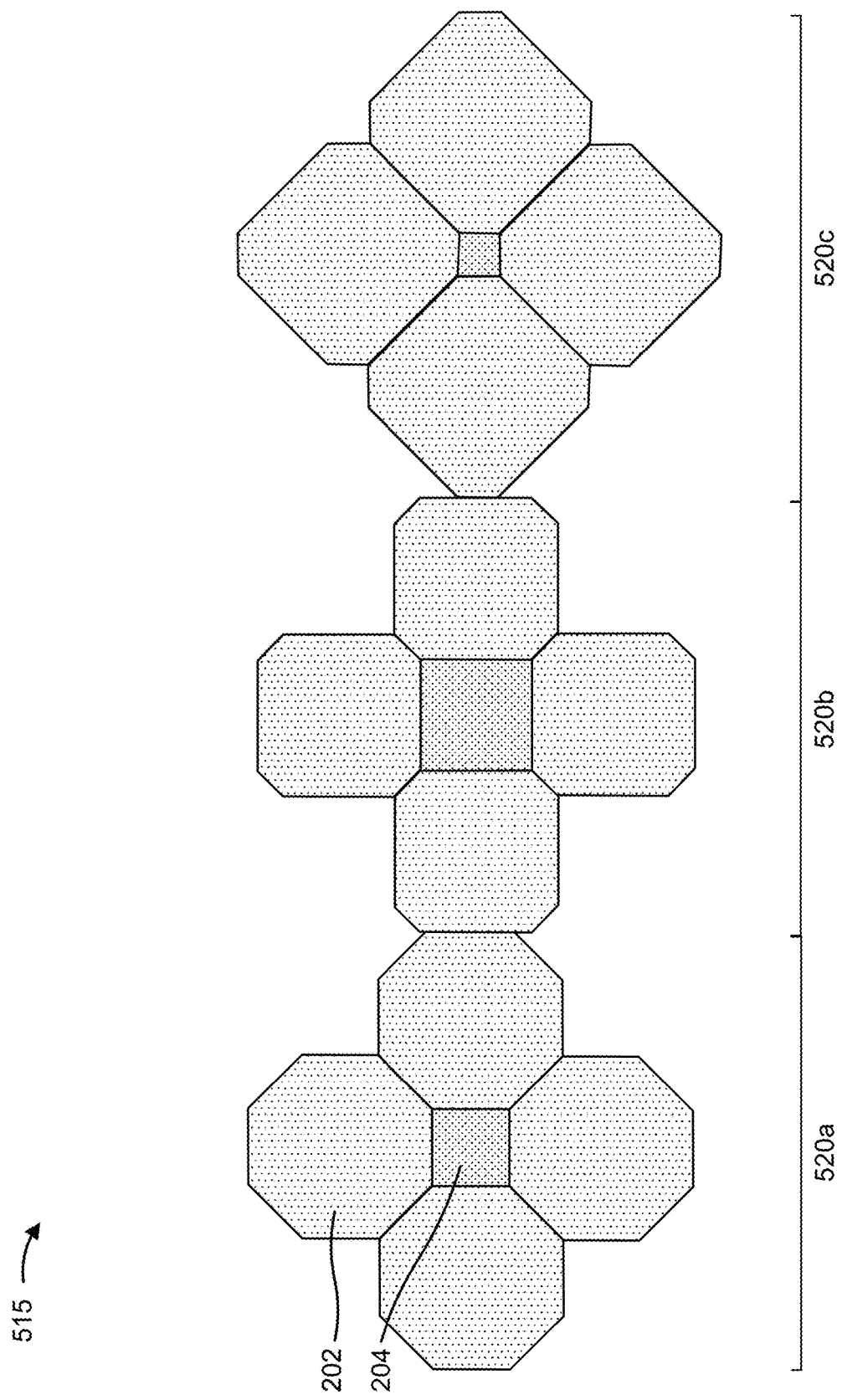

FIG. 5B illustrates an example 515 in which a pixel array includes a plurality of non-overlapping regions 520 of pixel sensor configurations. For example, region 520a of the pixel array may include a plurality of regular octagon-shaped pixel sensors 202 and one or more square-shaped pixel sensors 204. As another example, a region 520b of the pixel array may include a plurality of irregular octagon-shaped pixel sensors 202 and one or more square-shaped pixel sensors 204. As another example, a region 520c of the pixel array may include a plurality of irregular octagon-shaped pixel sensors 202 and one or more square-shaped pixel sensors 204.

Some attributes of the pixel sensor configurations in the different regions 520 may be different. For example, the size ratio or percentage between the octagon-shaped pixel sensors 202 and the square-shaped pixel sensor 204 in region 520a, the size ratio or percentage between the octagon-shaped pixel sensors 202 and the square-shaped pixel sensor 204 in region 520b, and the size ratio or percentage between the octagon-shaped pixel sensors 202 and the square-shaped pixel sensor 204 in region 520c may be different size ratios or different percentages. As another example, the sizes (e.g., side length(s) and/or widths) of the octagon-shaped pixel sensors 202 may be different in regions 520a, 520b, and 520c, and the sizes (e.g., side length(s) or widths) of the square-shaped pixel sensors 204 may be different in regions 520a, 520b, and 520c.

Some attributes of the pixel sensor configurations in the different regions 520 may be the same. For example, the octagon-shaped pixel sensors 202 and the square-shaped pixel sensor 204 in region 520a, the octagon-shaped pixel sensors 202 and the square-shaped pixel sensor 204 in region 520b, and the octagon-shaped pixel sensors 202 and the square-shaped pixel sensor 204 in region 520c, may all be rotated in the same orientation.

Figure 5C:
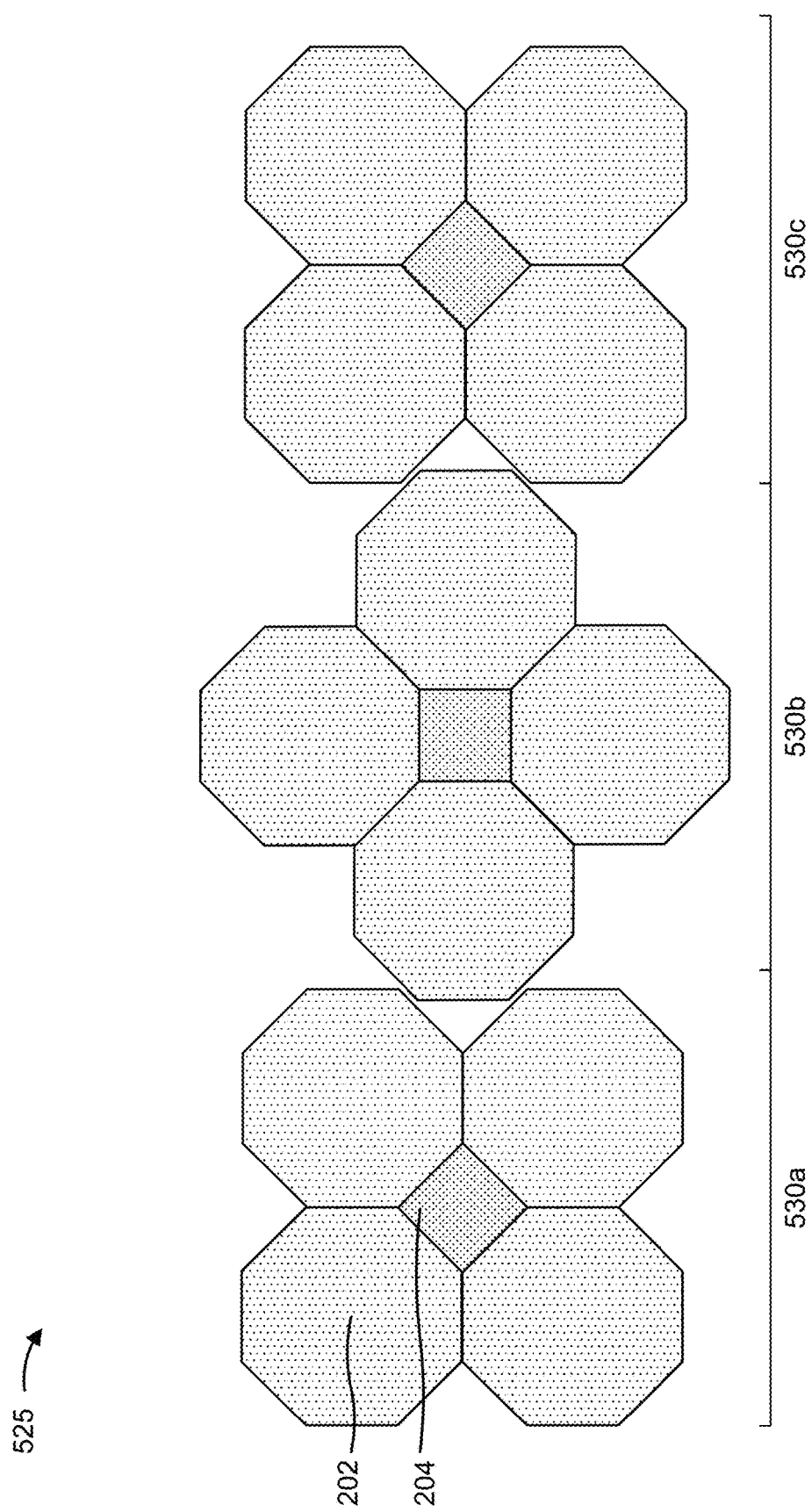

FIG. 5C illustrates an example 525 in which a pixel array includes a plurality of non-overlapping regions 530 of pixel sensor configurations. For example, region 530a of the pixel array may include a plurality of regular octagon-shaped pixel sensors 202 and one or more square-shaped pixel sensors 204. As another example, a region 530b of the pixel array may include a plurality of regular octagon-shaped pixel sensors 202 and one or more square-shaped pixel sensors 204. As another example, a region 530c of the pixel array may include a plurality of regular octagon-shaped pixel sensors 202 and one or more square-shaped pixel sensors 204.

Some attributes of the pixel sensor configurations in the different regions 530 may be different. For example, the octagon-shaped pixel sensors 202 and the square-shaped pixel sensor 204 in region 530a may be rotated 45 degrees in a different orientation relative to the octagon-shaped pixel sensors 202 and the square-shaped pixel sensor 204 in region 530b. As another example, the octagon-shaped pixel sensors 202 and the square-shaped pixel sensor 204 in region 530b may be rotated 45 degrees in a different orientation relative to the octagon-shaped pixel sensors 202 and the square-shaped pixel sensor 204 in region 530c.

Some attributes of the pixel sensor configurations in the different regions 530 may be the same. For example, the size ratio or percentage between the octagon-shaped pixel sensors 202 and the square-shaped pixel sensor 204 in regions 530a, 530b, and 530c may be the same. As another example, the sizes (e.g., side length(s) and/or widths) of the octagon-shaped pixel sensors 202 may be the same in regions 530a, 530b, and 530c, and the sizes (e.g., side length(s) or widths) of the square-shaped pixel sensors 204 may be the same in regions 530a, 530b, and 530c.

Figure 5D:
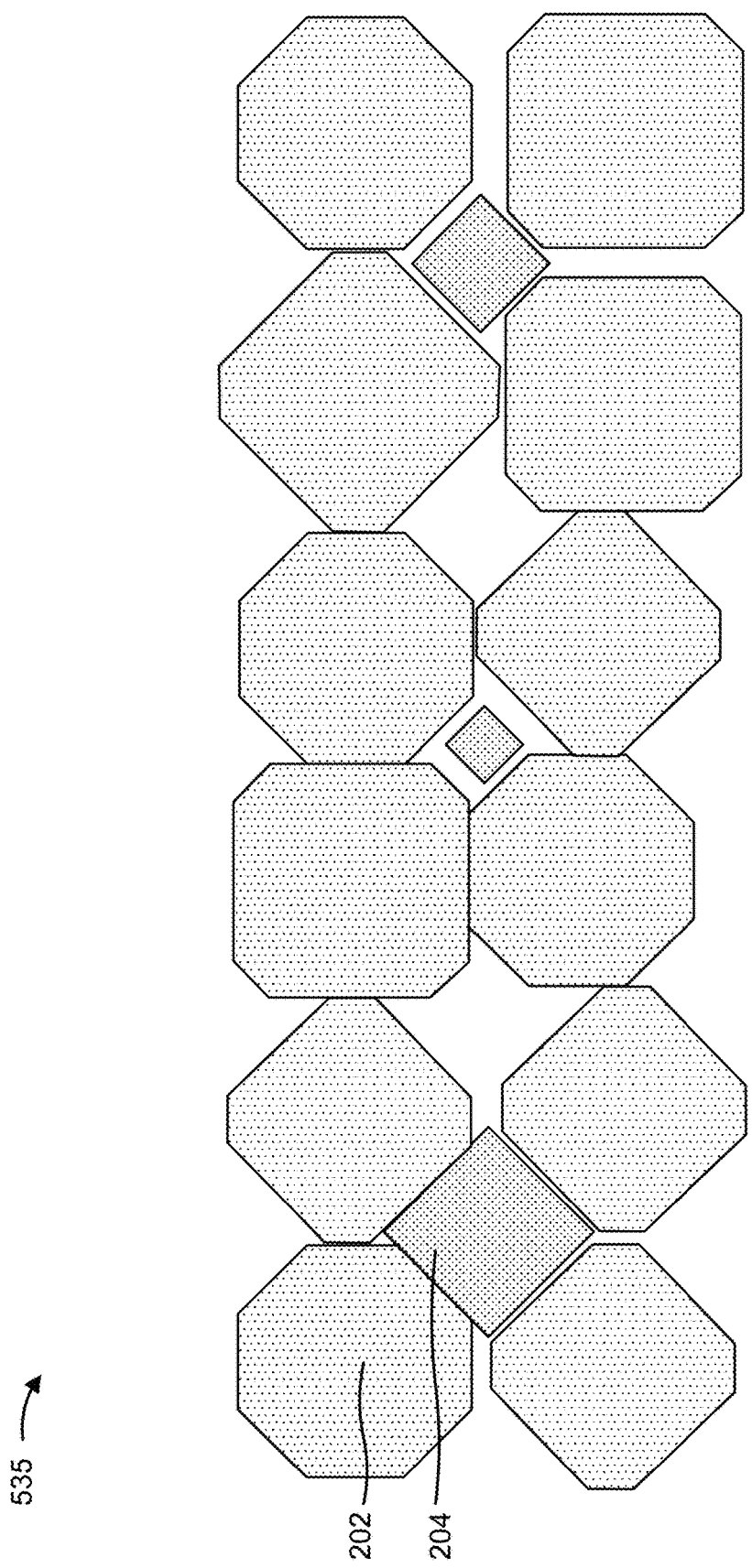

FIG. 5D illustrates an example 535 in which a pixel array includes a region having a non-uniform arrangement of octagon-shaped pixel sensors 202 and/or square-shaped pixel sensors 204. In this example, octagon-shaped pixel sensors 202 having different size lengths, and/or different widths may be interspersed, intermixed, and/or otherwise distributed throughout the region of the pixel array, and/or square-shaped pixel sensors 204 having different size lengths or widths may be interspersed, intermixed, and/or otherwise distributed throughout the region of the pixel array.

Octagon-shaped pixel sensors 202 and/or square-shaped pixel sensors 204 may be arranged in other example configurations in a pixel array than the examples described above in connection with FIGS. 5A-5D. In some implementations, the sizes (e.g., side length(s) and/or widths) of octagon-shaped pixel sensors 202 may be different in two or more regions of a pixel array and/or the sizes (e.g., side length(s) or widths) of square-shaped pixel sensors 204 may be different in two or more regions of the pixel array. In some implementations, the sizes (e.g., side length(s) and/or widths) of the octagon-shaped pixel sensors 202 may be the same in two or more regions of a pixel array and/or the sizes (e.g., side length(s) or widths) of square-shaped pixel sensors 204 may be the same in two or more regions of the pixel array. In some implementations, the orientations of octagon-shaped pixel sensors 202 may be different in two or more regions of a pixel array and/or the orientations of square-shaped pixel sensors 204 may be different in two or more regions of the pixel array. In some implementations, the orientations of octagon-shaped pixel sensors 202 may be the same in two or more regions of a pixel array and/or the orientations of square-shaped pixel sensors 204 may be the same in two or more regions of the pixel array.

In some implementations, the sizes (e.g., side length(s) and/or widths) of octagon-shaped pixel sensors 202 may be the same in two or more regions of a pixel array and/or the sizes (e.g., side length(s) or widths) of square-shaped pixel sensors 204 may be the same in two or more regions of the pixel array. In some implementations, the size ratios or percentages between octagon-shaped pixel sensors 202 and square-shaped pixel sensors 204 may be different in two or more regions of a pixel array. In some implementations, the sizes ratios or percentages between octagon-shaped pixel sensors 202 and square-shaped pixel sensors 204 may be the same in two or more regions of a pixel array.

In some implementations, a quantity of octagon-shaped pixel sensors 202 may be different in two or more regions of a pixel array and/or a quantity of square-shaped pixel sensors 204 may be different in two or more regions of a pixel array. In some implementations, a quantity of octagon-shaped pixel sensors 202 may be the same in two or more regions of a pixel array and/or a quantity of square-shaped pixel sensors 204 may be the same in two or more regions of a pixel array. In some implementations, a pixel array may include a region of similarly configured octagon-shaped pixel sensors 202 and/or square-shaped pixel sensors 204, as well as a region having a non-uniform arrangement of octagon-shaped pixel sensors 202 and/or square-shaped pixel sensors 204.

As indicated above, FIGS. 5A-5D are provided as examples. Other examples may differ from what is described with regard to FIGS. 5A-5D. The configuration of the octagon-pixel sensors 202 and/or the configuration of the square-shaped pixel sensors 204 described above in connection with FIGS. 5A-5D may be arranged according to the examples described above and/or arranged according to other examples to achieve or satisfy one or more performance parameters and/or attributes, such as color saturation, noise, contrast, brightness, hue and saturation, light sensitivity, contour sharpness, image sensor size, pixel sensor density, and/or the like.

Figure 6A:
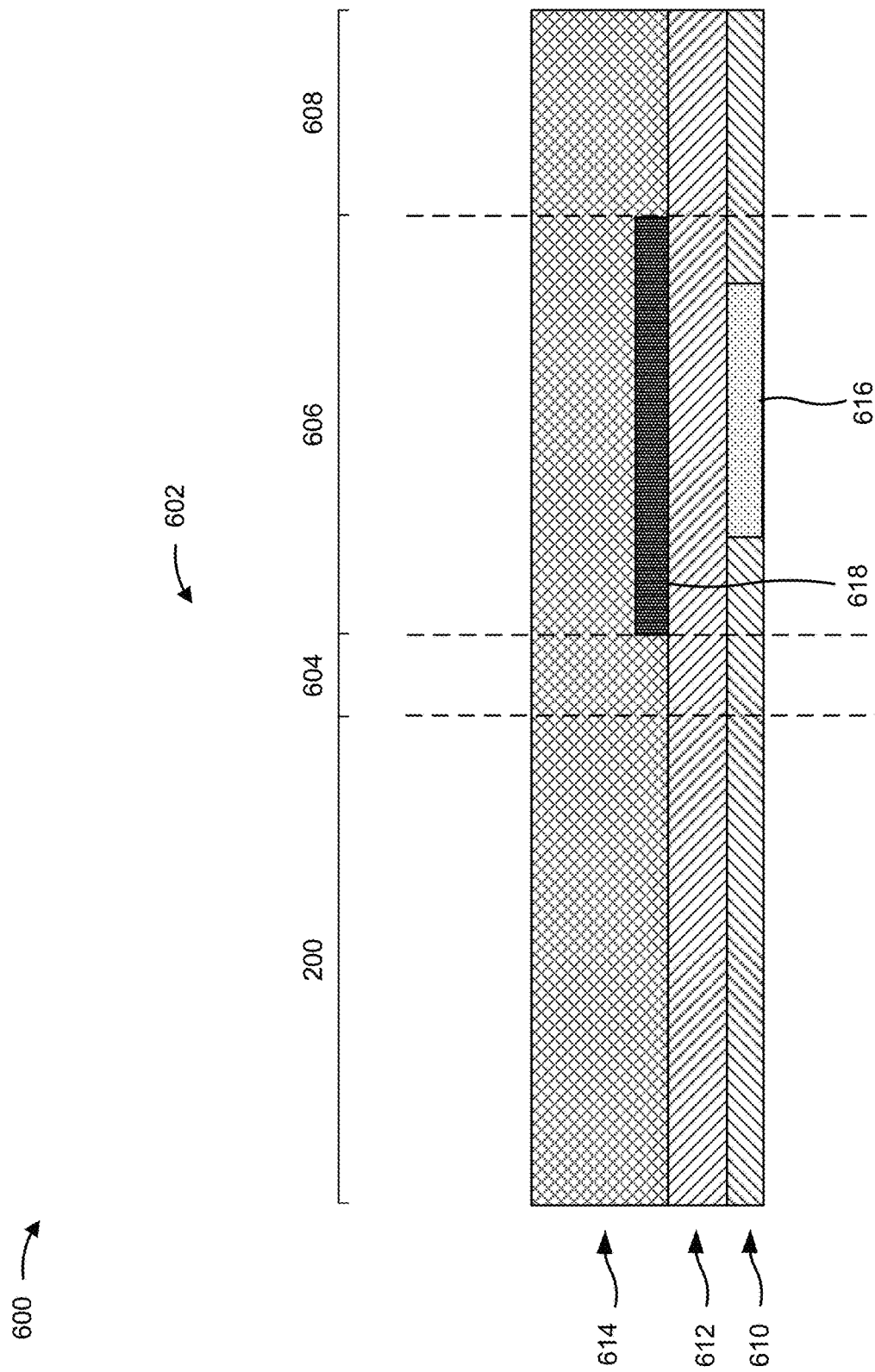
FIGS. 6A-6P are diagrams of an example implementation described herein.
Figure 6B:
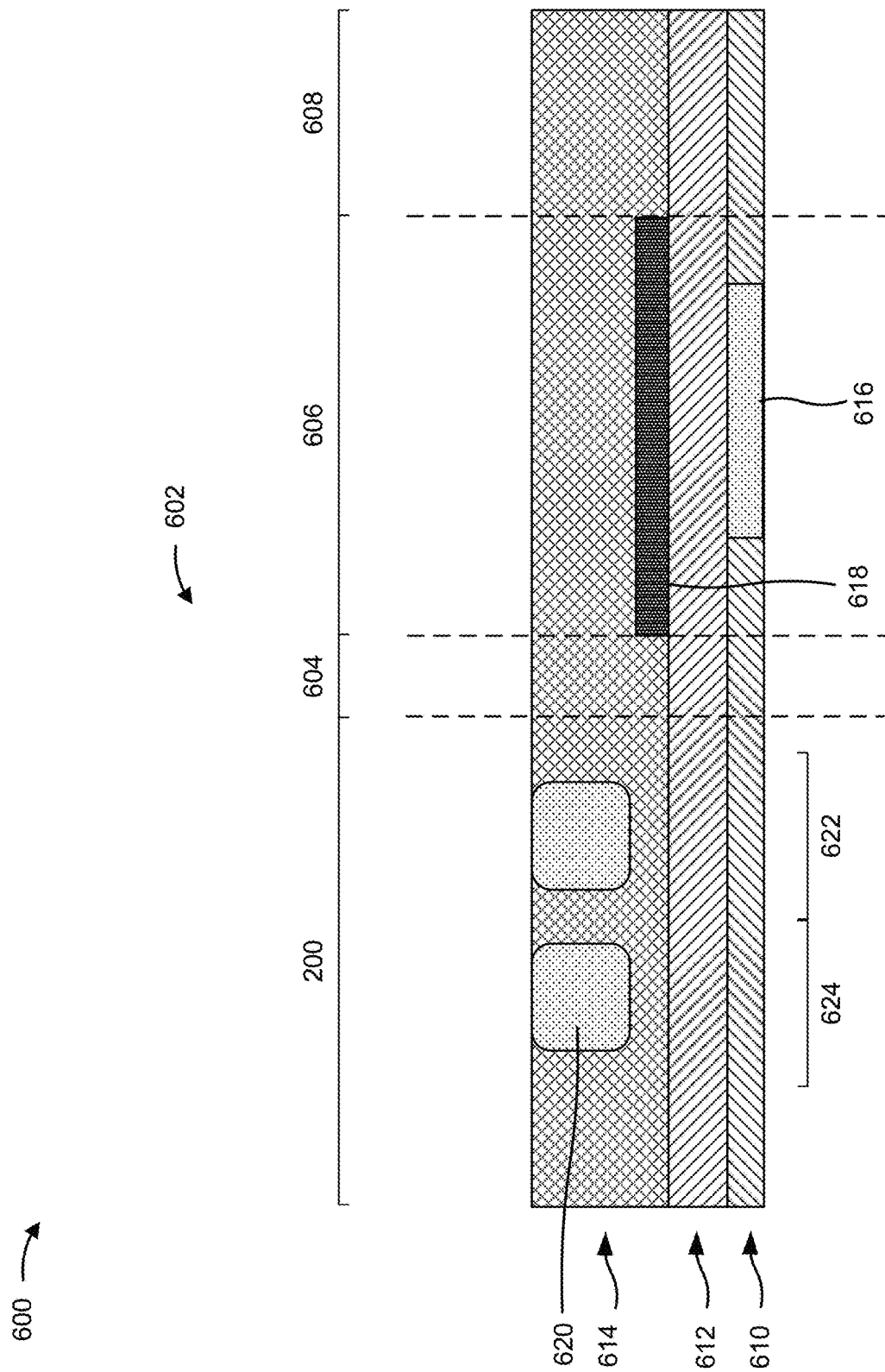
Figure 6C:
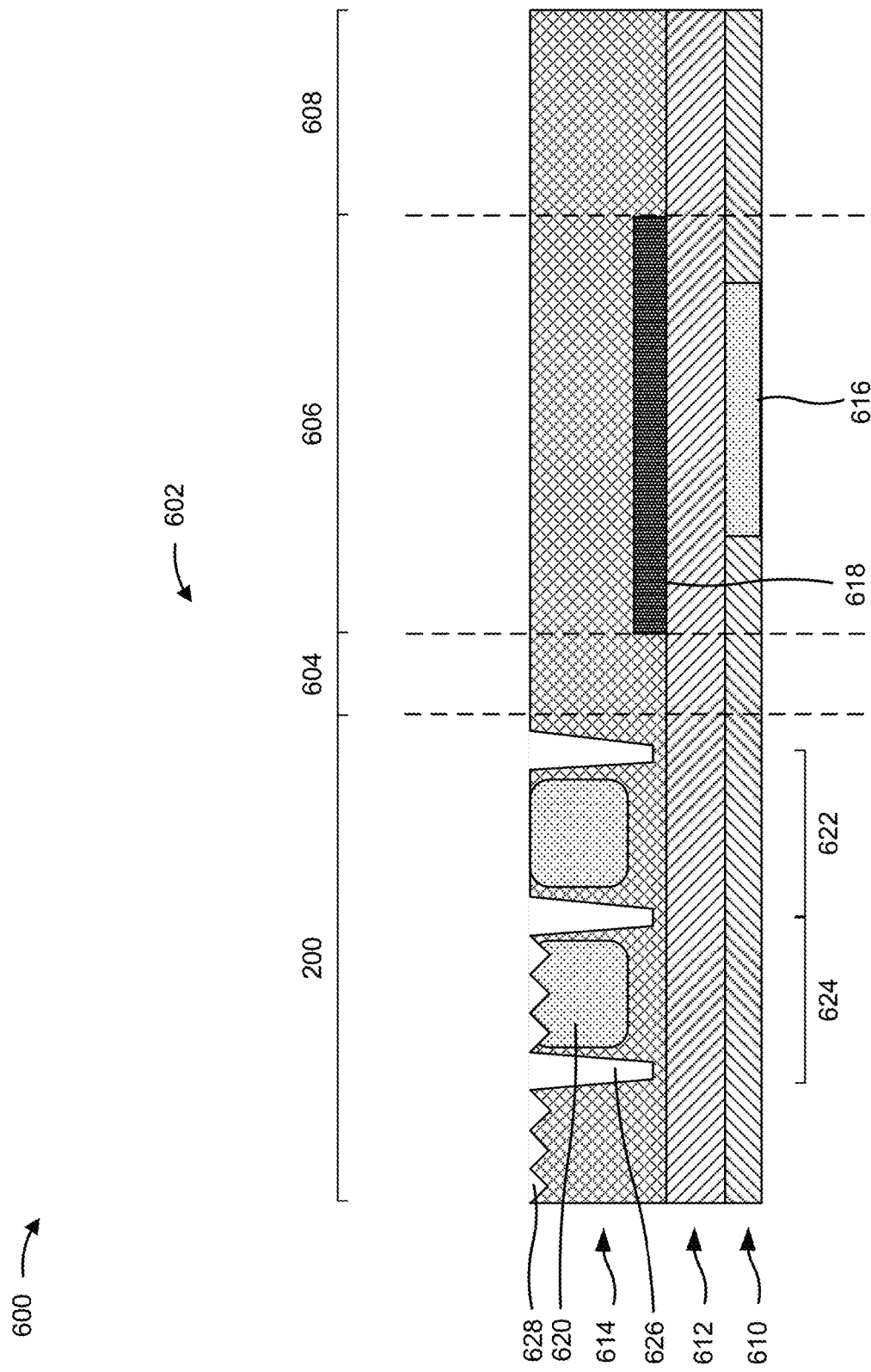
Figure 6D:
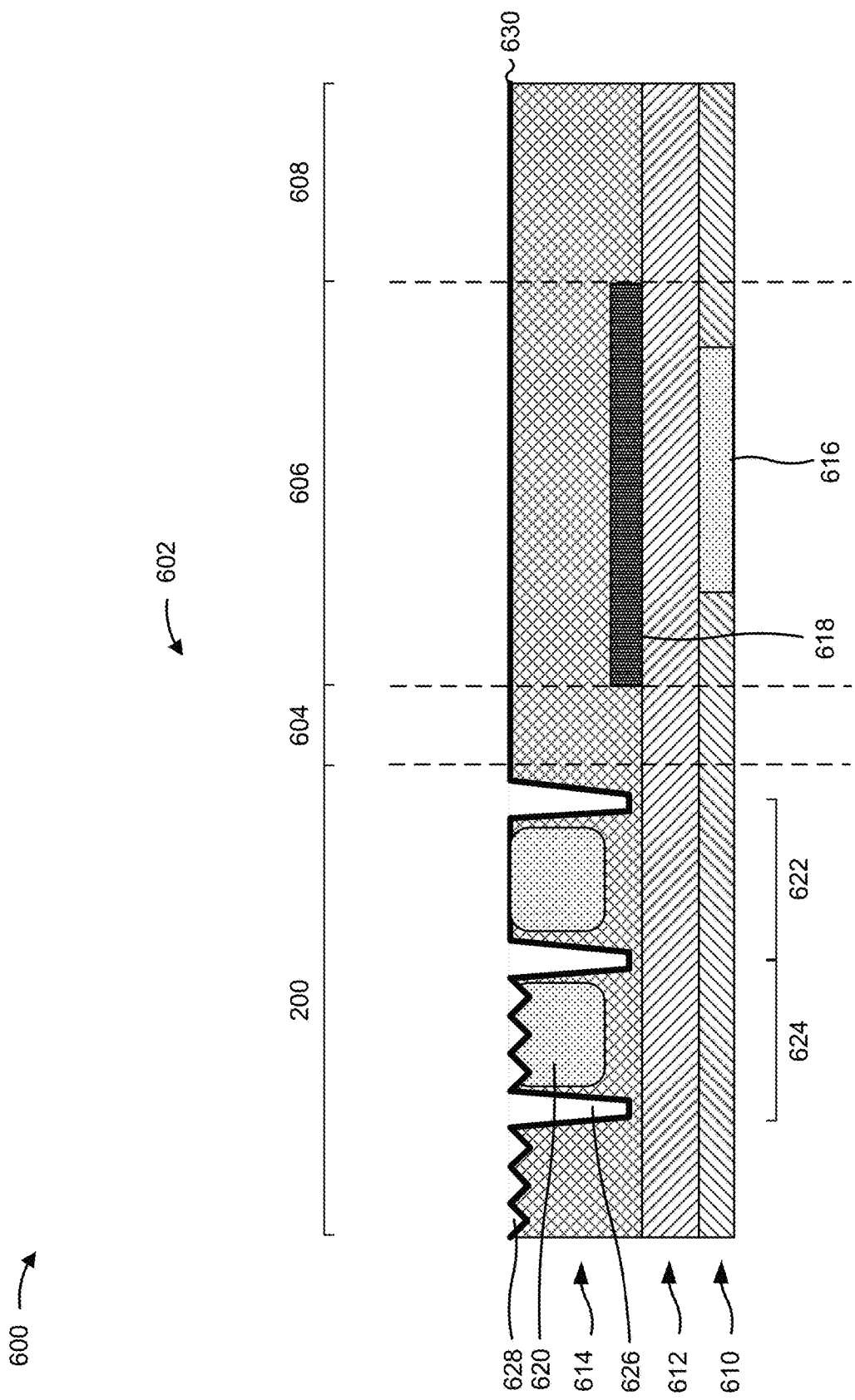
Figure 6E:
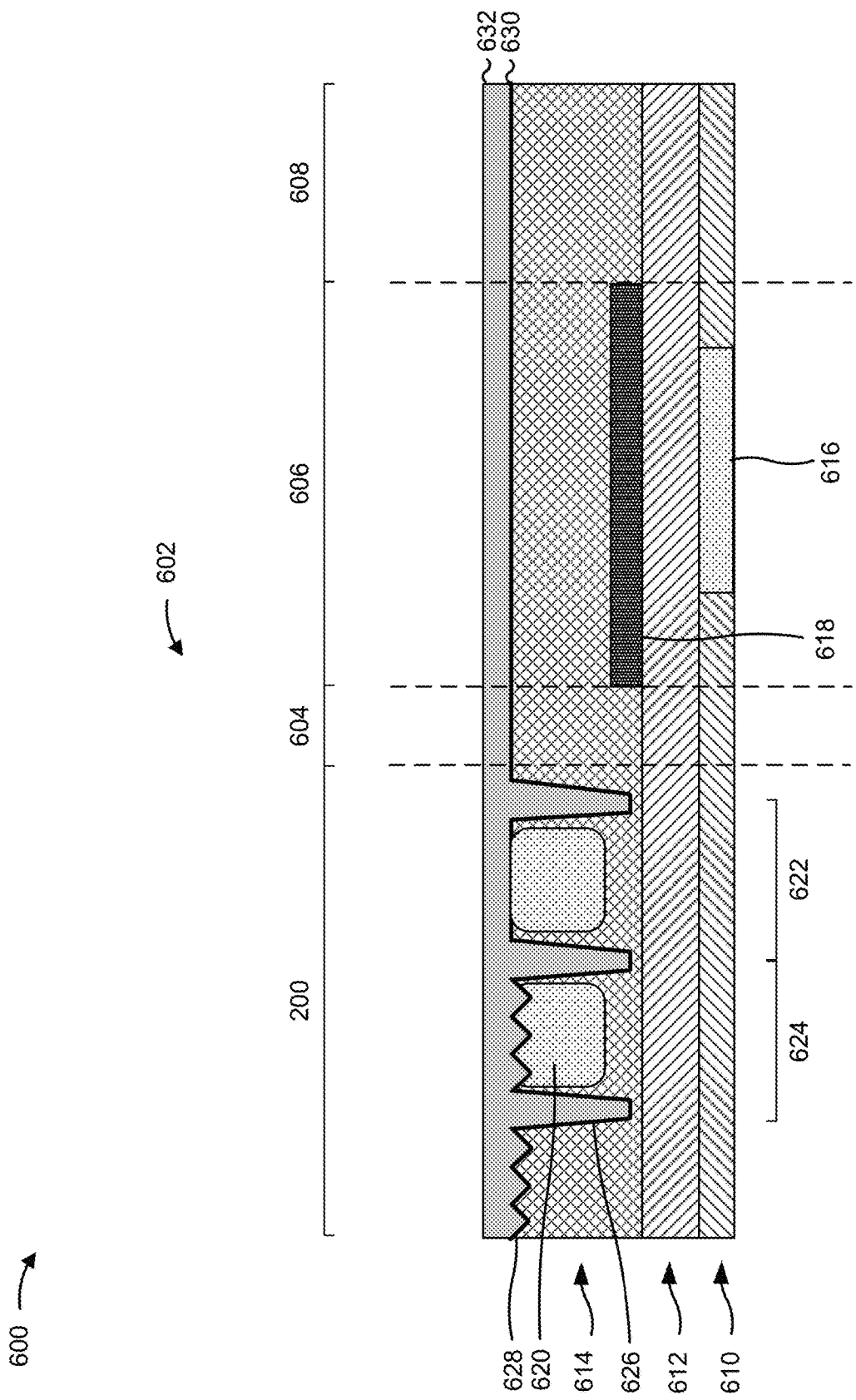
Figure 6F:
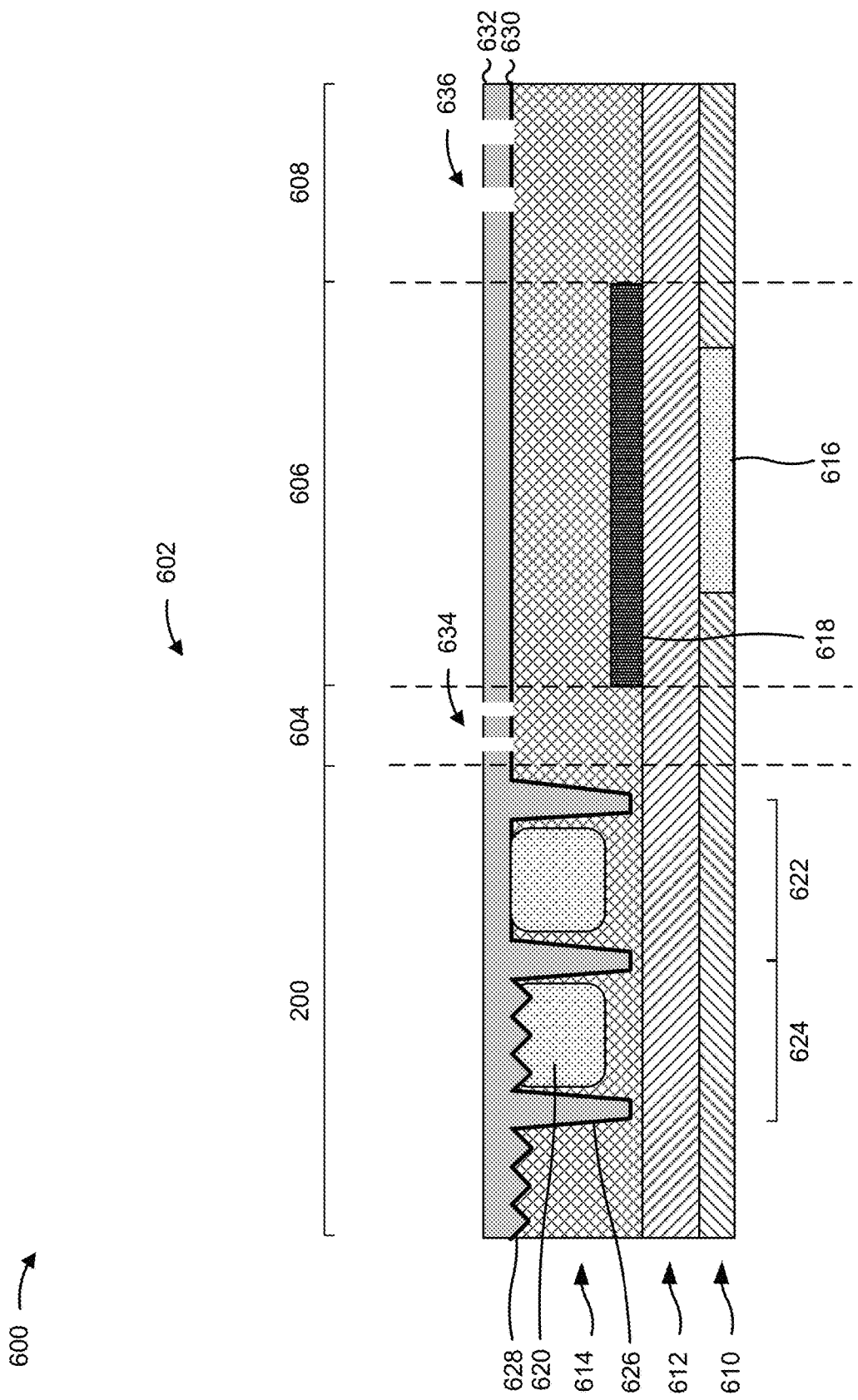
Figure 6G:
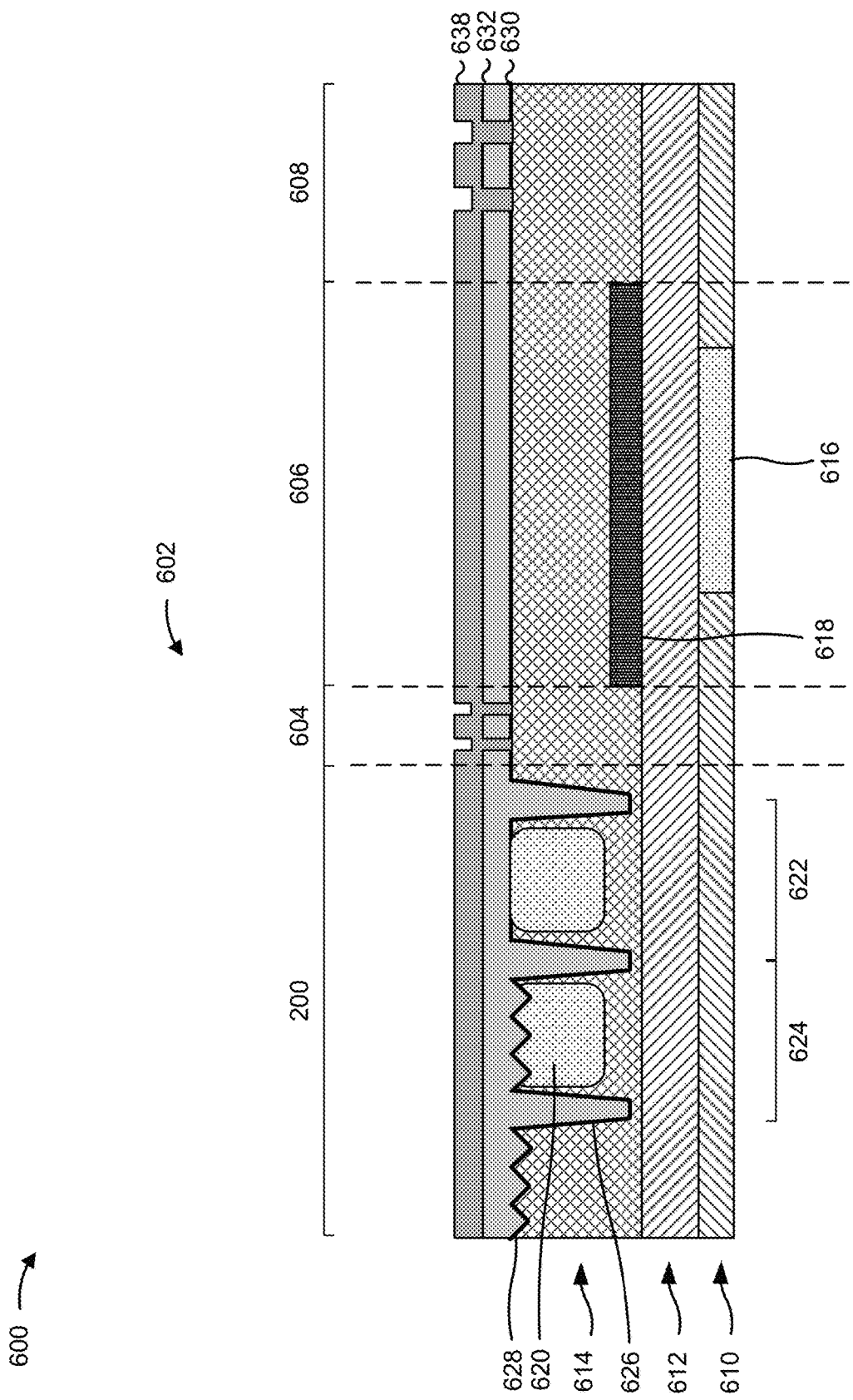
Figure 6H:
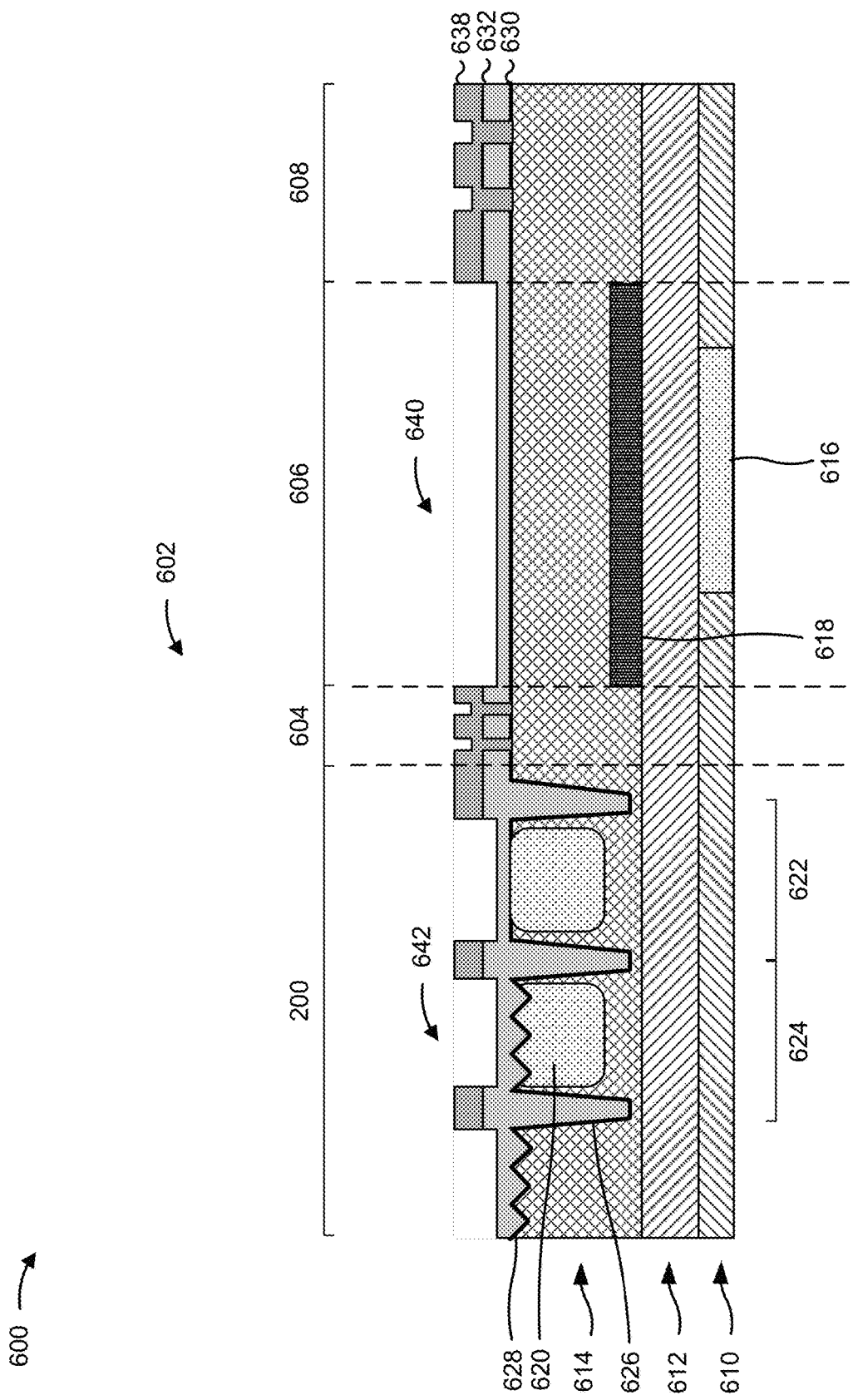
Figure 6I:
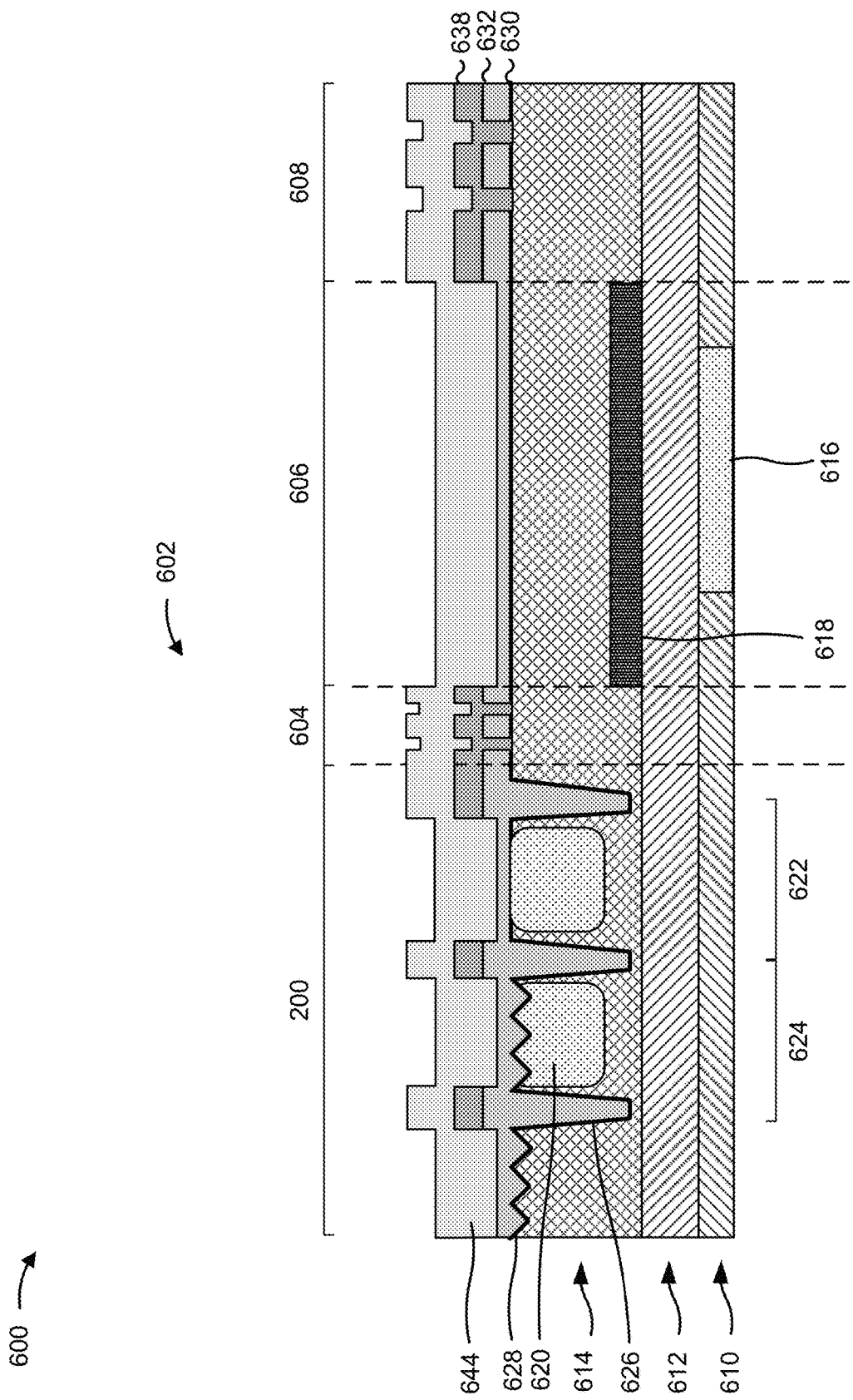
Figure 6J:
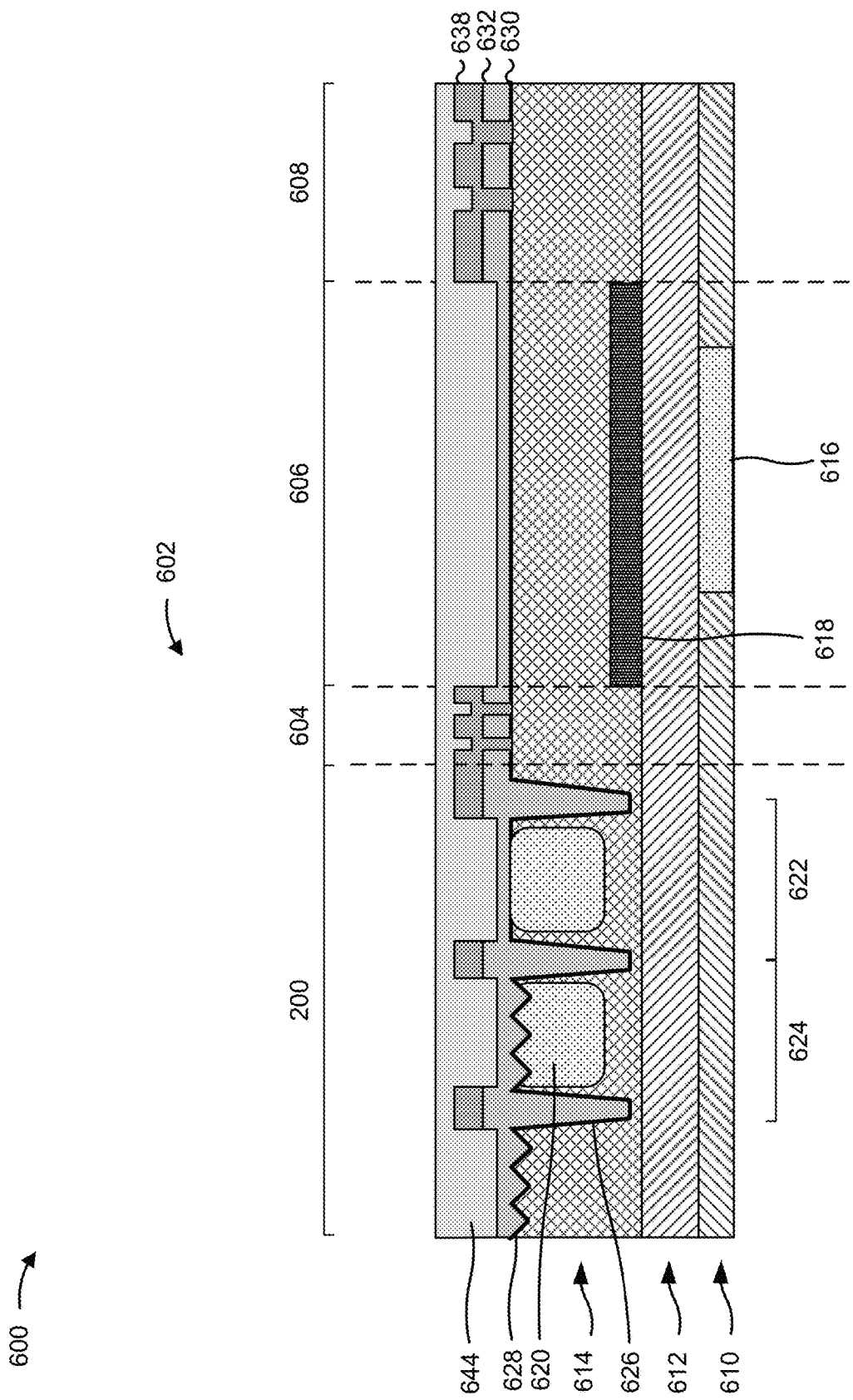
Figure 6K:
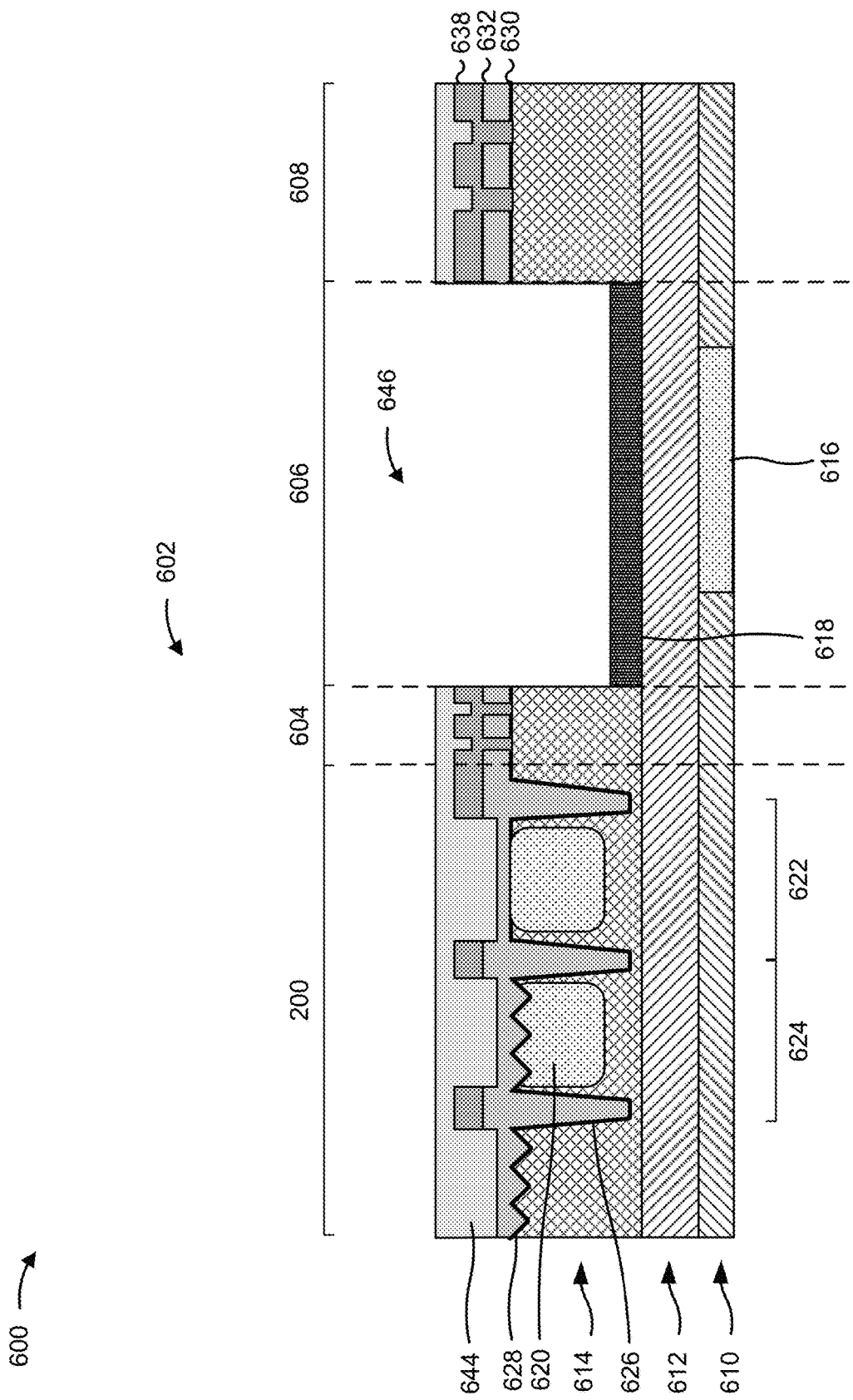
Figure 6L:
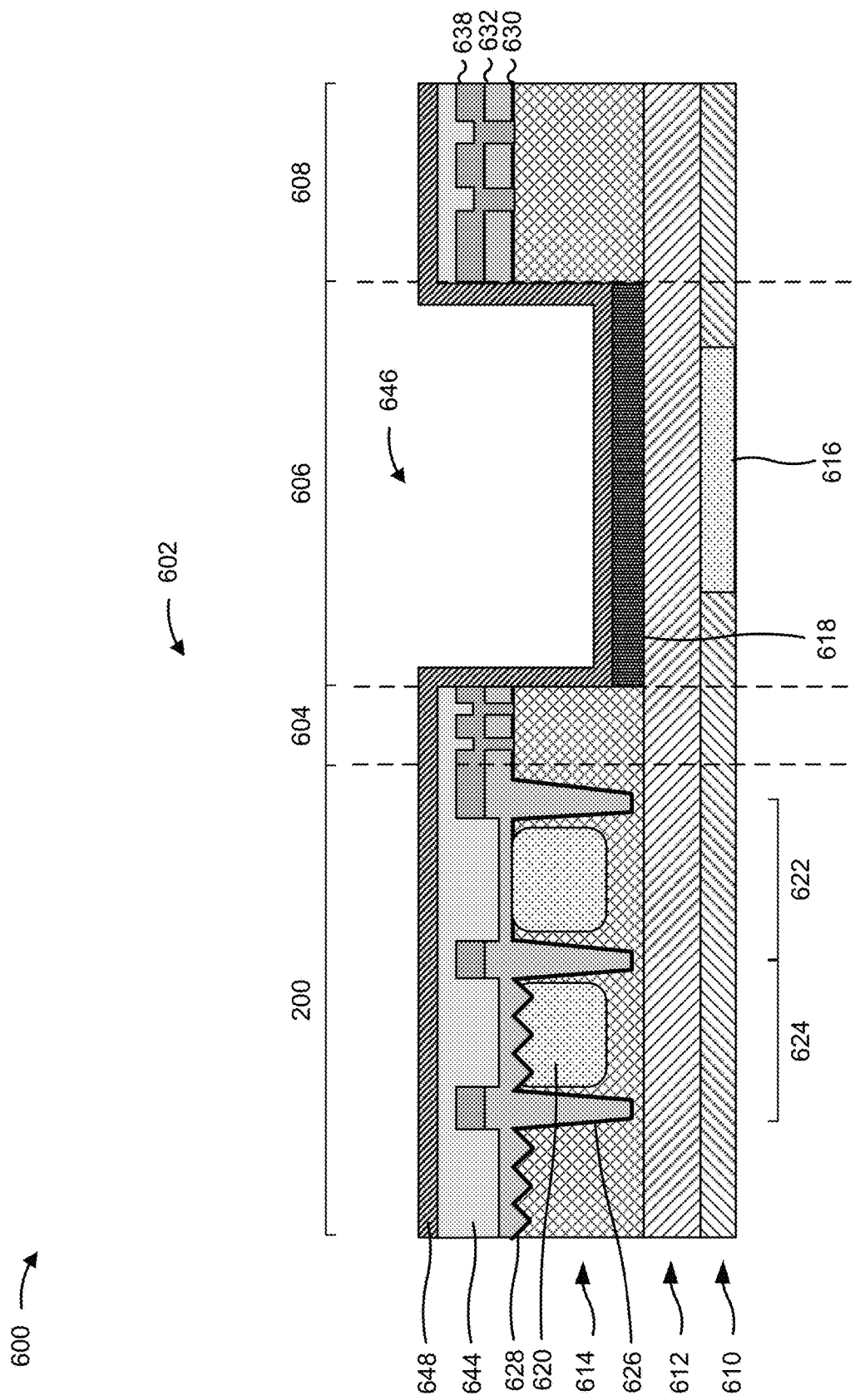
Figure 6M:
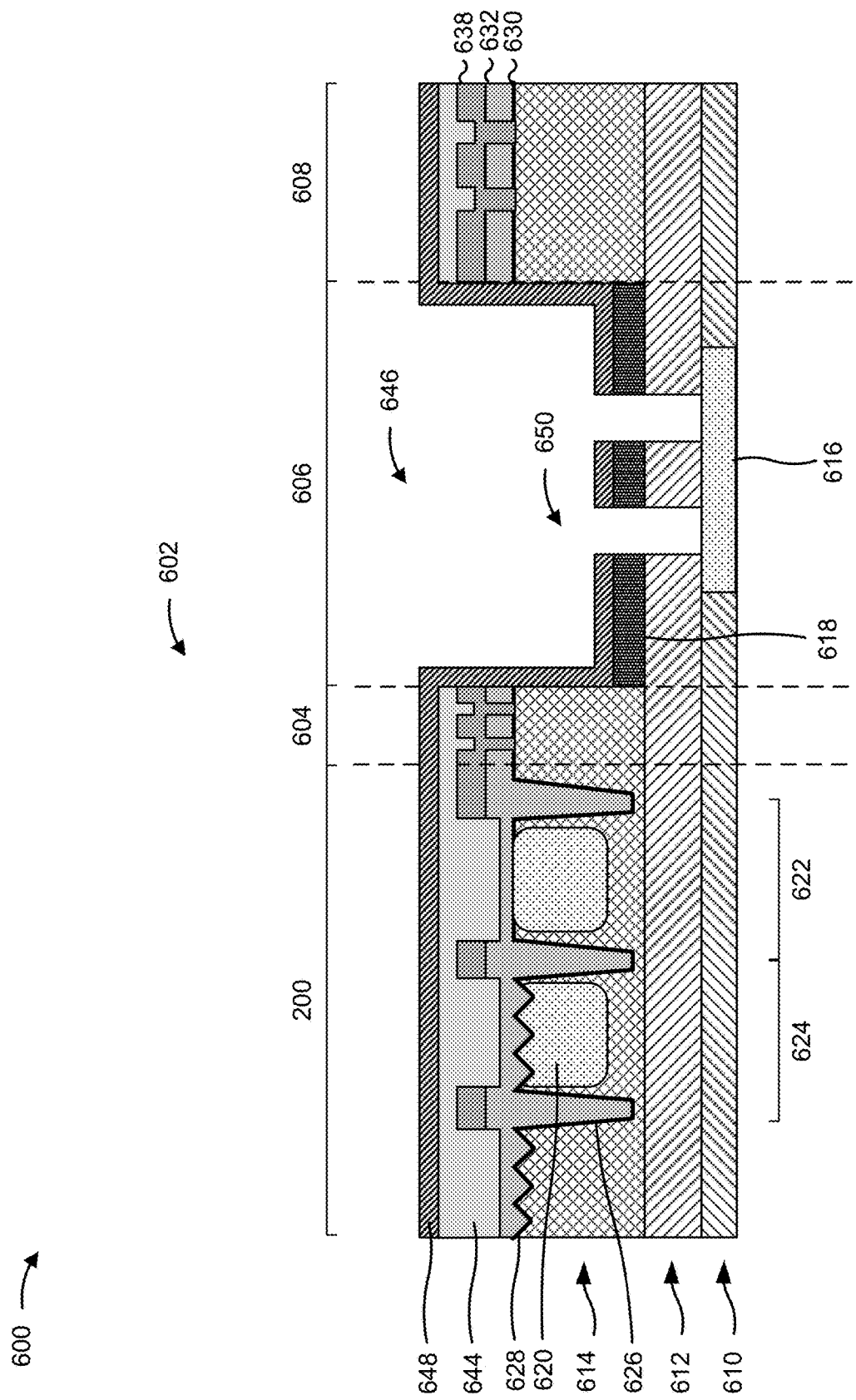
Figure 6N:
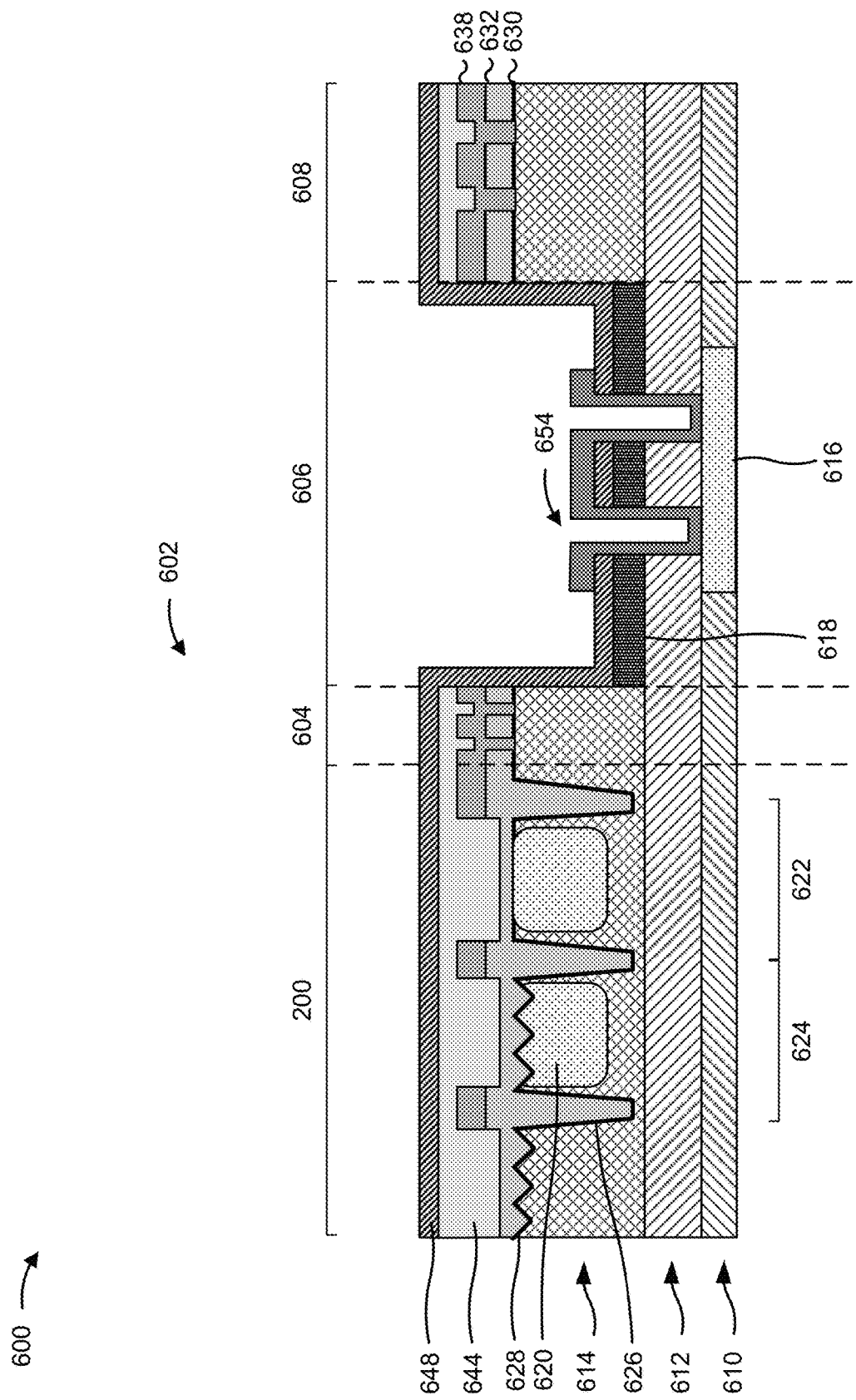
Figure 6O:
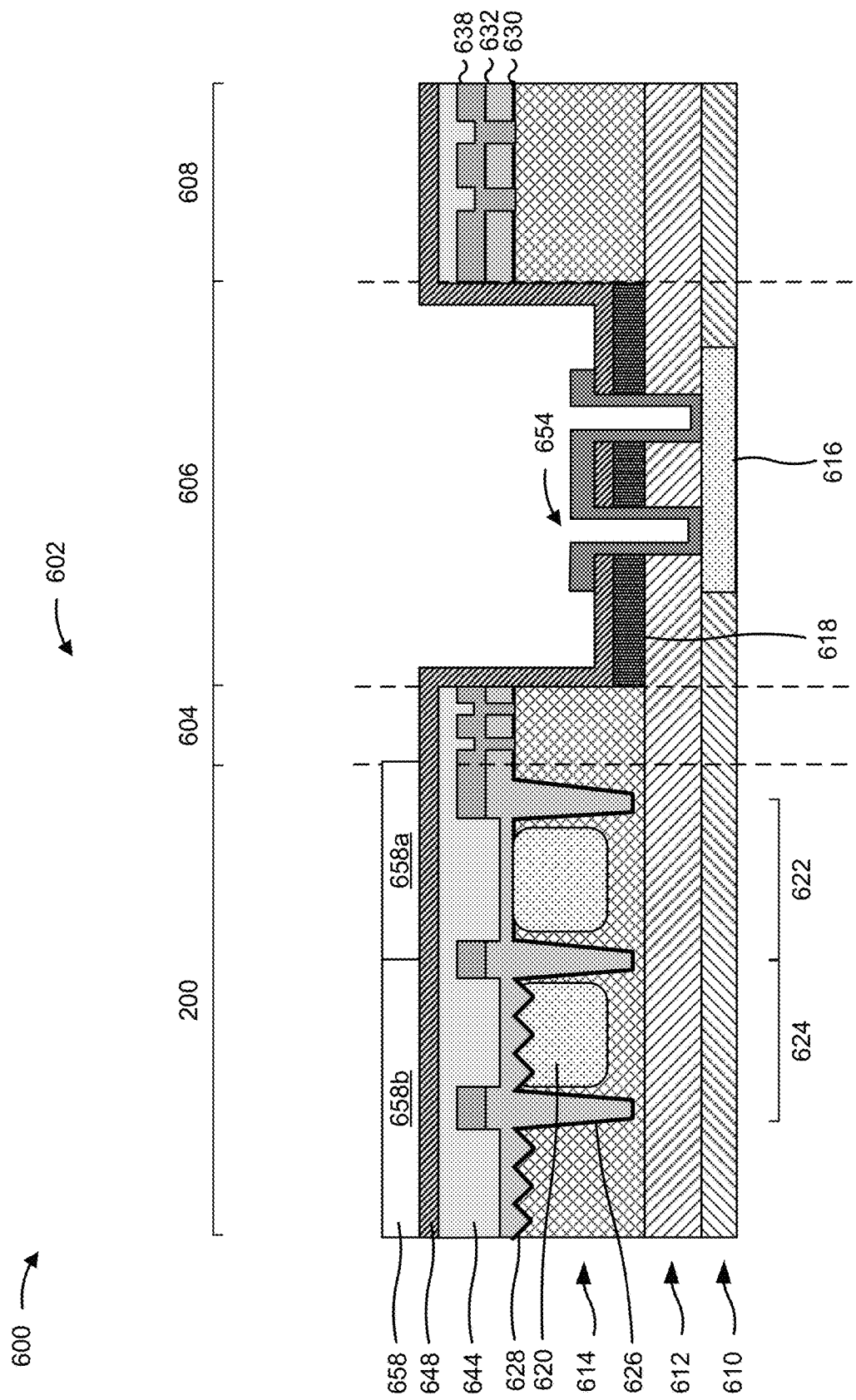
Figure 6P:
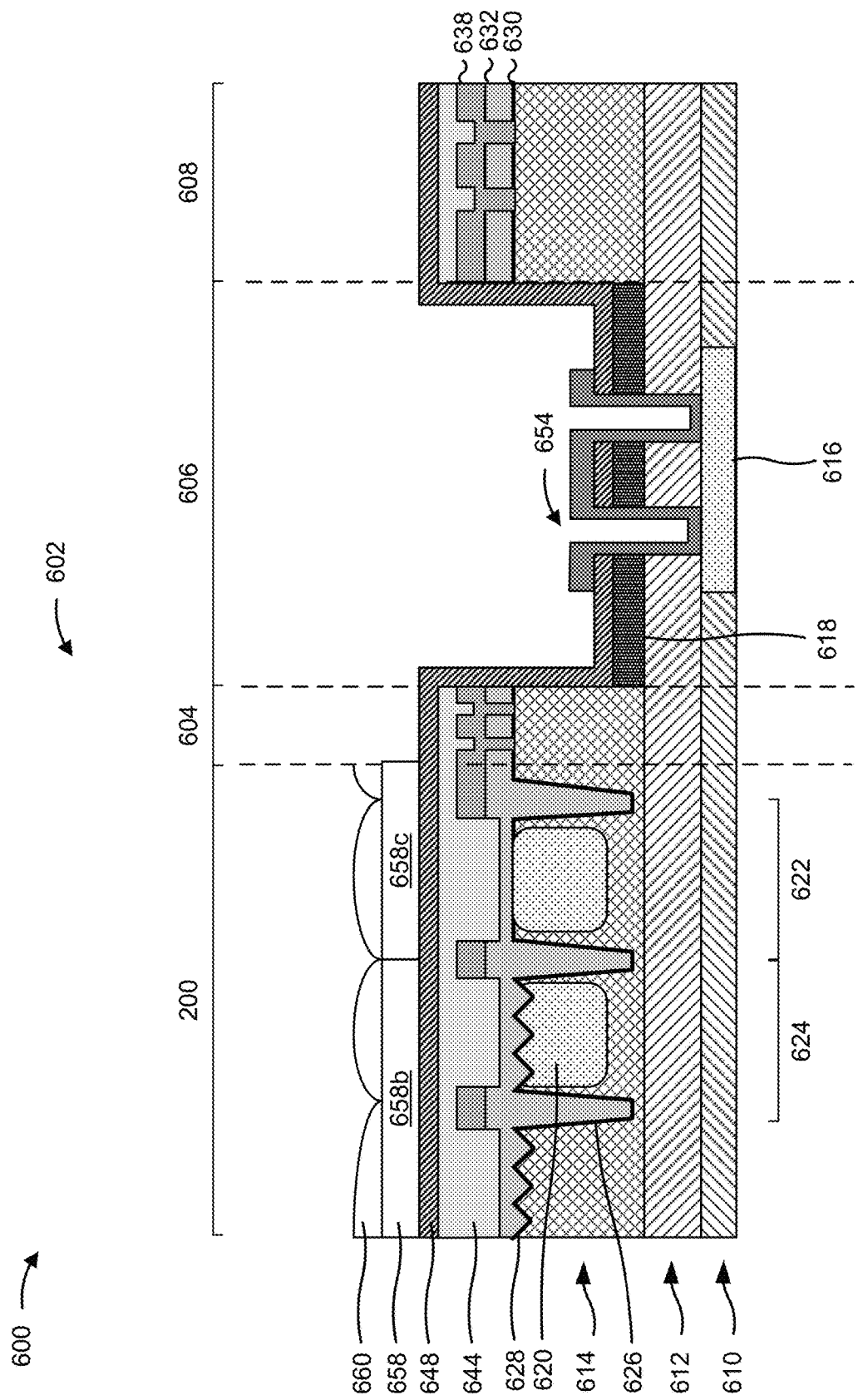

FIGS. 6A-6P are diagrams of an example implementation 600 described herein. Example implementation 600 may be an example process for forming an image sensor 602 including a pixel array 200 having octagon-shaped pixel sensors 202 and square-shaped pixel sensors 204. The image sensor 602 may include a CMOS image sensor, a BSI CMOS image sensor, or another type of image sensor.

As shown in FIG. 6A, the image sensor 602 may include a plurality of regions, such as the pixel array 200, a metal shield region 604, a bonding pad region 606 (which may also be referred to as an E-pad region), and a measurement region 608. Moreover, the image sensor 602 may include a plurality of layers, including an inter-metal dielectric (IMD) layer 610, an interlayer dielectric (ILD) layer 612, and a substrate 614.

The pixel array 200 may include the pixel sensors of the image sensor 602. The metal shield region 604 may include one or more devices that are maintained in an optically dark environment. For example, the metal shield region 604 may include a reference pixel that is used to establish a baseline of an intensity of light for the image sensor 602. The bonding pad region 606 may include one or more conductive bonding pads 616 (or E-pads) through which electrical connections between the image sensor 602 and outside devices may be established. Moreover, the bonding pad region 606 may include a shallow trench isolation (STI) structure 618 to provide electrical isolation in the bonding pad region 606. The measurement region 608 may include one or more devices configured to perform measurements based on the incident light sensed in the pixel array 200. For example, the measurement region 608 may include one or more application-specific integrated circuit (ASIC) devices, one or more system-on-chip (SOC) devices, one or more transistors, and/or one or more other components.

The IMD layer 610 may include the bonding pads 616 and other metal interconnecting structures that connect the image sensor 602 to a package, to external electrical connections, and/or to other external devices. The ILD layer 612 may provide electrical and optical isolation between the IMD layer 610 and the substrate 614. The substrate 614 may include a silicon substrate, a substrate formed of a material including silicon, a III-V compound semiconductor substrate such as gallium arsenide (GaAs) substrate, a silicon on insulator (SOI) substrate, or another type of substrate is capable of generating a charge from photons of incident light.

As shown in FIG. 6B, one or more semiconductor processing tools may form a plurality of photodiodes 620 in the substrate 614. For example, the implantation tool 114 may dope the portions of the substrate 614 using an ion implantation technique to form a respective photodiode 620 for a plurality of pixel sensors, such as a visible light pixel sensor 622 and an NIR light pixel sensor 624. The substrate 614 may be doped with a plurality of types of ions to form a p-n junction for each photodiode 620. For example, the substrate 614 may be doped with an n-type dopant to form a first portion (e.g., an n-type portion) of a photodiode 620 and a p-type dopant to form a second portion (e.g., a p-type portion) of the photodiode 620. In some implementations, another technique is used to form the photodiodes 620 such as diffusion.

In some implementations, a plurality of visible light pixel sensors 622 and/or a plurality of NIR light pixel sensors 624 may be formed in the pixel array 200. In some implementations, one or more of the visible light pixel sensors 622 may be octagon-shaped pixel sensors (e.g., octagon-shaped pixel sensors 202) and/or one or more of the visible light pixel sensors 622 may be square-shaped pixel sensors (e.g., square-shaped pixel sensors 204). In some implementations, one or more of the NIR pixel sensors 624 may be octagon-shaped pixel sensors (e.g., octagon-shaped pixel sensors 202) and/or one or more of the NIR light pixel sensors 624 may be square-shaped pixel sensors (e.g., square-shaped pixel sensors 204).

As shown in FIG. 6C, one or more deep trench isolation (DTI) structures 626 may be formed in the substrate 614. In particular, a DTI structure 626 may be formed between each of the photodiodes 620 of the pixel sensors. As an example, a DTI structure 626 may be formed between the photodiodes 620 of the visible light pixel sensor 622 and an adjacent pixel sensor, a DTI structure 626 may be formed between the photodiodes 620 of the visible light pixel sensor 622 and the NIR light pixel sensor 624, a DTI structure 626 may be formed between the photodiodes 620 of the NIR light pixel sensor 624, and so on. In some implementations, if the pixel array 200 is a BSI pixel array, the DTI structure(s) 626 may be backside DTI (BDTI) structures formed in a backside of the substrate 614.

In some implementations, one or more semiconductor processing tools may be used to form the one or more DTI structures 626 in the substrate 614. For example, the deposition tool 102 may form a photoresist layer on the substrate 614, the exposure tool 104 may expose the photoresist layer to a radiation source to pattern the photoresist layer, the developer tool 106 may develop and remove portions of the photoresist layer to expose the pattern, and the etch tool 108 may etch the one or more portions of substrate 614 to form the one or more DTI structures 626 in the substrate 614. In some implementations, a photoresist removal tool removes the remaining portions of the photoresist layer (e.g., using a chemical stripper and/or another technique) after the etch tool 108 etches the substrate 614.

As further shown in FIG. 6C, one or more high absorption regions 628 may be formed in the substrate 614 and/or in one or more of the photodiodes 620. Each high absorption region 628 may be defined by a shallow trench. A plurality of adjacent high absorption regions 628 may form a periodic or zig-zag structure that is etched or otherwise formed in the substrate 614 and/or the photodiode(s) 620. The one or more high absorption regions 628 may be formed in a same side of the substrate 614 as the one or more DTI structures 626, and may be formed using similar techniques and/or semiconductor processes as described above in connection with forming the one or more DTI structures 626. While FIG. 6C illustrates the high absorption regions 628 being formed in the NIR light pixel sensor 624, high absorption regions 628 may also, or alternatively, be formed in the visible light pixel sensor 622.

As shown in FIG. 6D, an antireflective coating (ARC) layer 630 may be formed above and/or on the substrate 614, may be formed in the DTI structures 626, and may be formed in the high absorption regions 628. In particular, a semiconductor processing tool (e.g., the deposition tool 102) may deposit the ARC layer 630 using a CVD technique, a PVD technique, an ALD technique, or another type of deposition technique. The ARC layer 630 may include a suitable material for reducing a reflection of incident light projected toward the photodiodes 620. For example, the ARC layer 630 may include nitrogen-containing material. In some implementations, the semiconductor processing tool may form the ARC layer 630 to a thickness in a range from approximately 200 angstroms to approximately 1000 angstroms.

As shown in FIG. 6E, the one or more DTI structures 626 and the one or more high absorption regions 628 may each be filled with an oxide material. In particular, a semiconductor processing tool (e.g., the deposition tool 102) may deposit the oxide material (e.g., a silicon oxide ($SiO_x$) or another type of oxide) such that an oxide layer 632 is formed in the DTI structures 626, in the high absorption regions 628, and over the substrate 614. The semiconductor processing tool may deposit the oxide material using various CVD techniques and/or atomic layer deposition (ALD) techniques, such as PECVD, HDP-CVD, SACVD, or PEALD.

As shown in FIG. 6F, a plurality of openings 634 (or trenches) may be formed through the oxide layer 632 and the ARC layer 630 in the metal shield region 604, and a plurality of openings 636 (or trenches) may be formed through the oxide layer 632 and the ARC layer 630 to the substrate 614 in the measurement region 608. The openings 634 and 636 may be formed by coating the oxide layer 632 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the openings 634 and 636 into the oxide layer 632 and the ARC layer 630 to the substrate 614 (e.g., using the etching tool 108) based on the pattern in the photoresist.

As shown in FIG. 6G, a metal shielding layer 638 may be formed over and/or on the oxide layer 632 and in the openings 634 and 636. The metal shielding layer 638 may provide shielding for the components and/or devices formed in the metal shield region 604 and in the measurement region 608. The metal shielding layer 638 may be formed of a metal material, such as gold, silver, aluminum, a metal alloy, or a similar metal. In some implementations, a semiconductor processing tool (e.g., the plating tool 112) may form the metal shielding layer 638 using a plating technique such as electroplating (or electro-chemical deposition). In these examples, the semiconductor processing tool may apply a voltage across an anode formed of a plating material and a cathode (e.g., a substrate). The voltage causes a current to oxidize the anode, which causes the release of plating material ions from the anode. These plating material ions form a plating solution that travels through a plating bath toward the image sensor 602. The plating solution reaches the image sensor 602 and deposits plating material ions onto the oxide layer 632 and in the openings 634 and 636 to form the metal shielding layer 638.

As shown in FIG. 6H, an opening 640 (or a trench) may be formed through the metal shielding layer 638 and in a portion of the oxide layer 632 in the bonding pad region 606, and a plurality of openings 642 (or trenches) may be formed through the metal shielding layer 638 and in a portion of the oxide layer 632 in the pixel array 200. The openings 640 and 642 may be formed by coating the metal shielding layer 638 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the openings 640 and 642 into the metal shielding layer 638 and in a portion of the oxide layer 632 (e.g., using the etching tool 108) based on the pattern in the photoresist.

As shown in FIG. 6I, a BSI oxide layer 644 may be formed in the openings 640 and 642, and over the metal shielding layer 638 and the oxide layer 632. In particular, a semiconductor processing tool (e.g., the deposition tool 102) may deposit an oxide material (e.g., a silicon oxide ($SiO_x$) or another type of oxide) such that the BSI oxide layer 644 is formed using various CVD techniques and/or atomic layer deposition (ALD) techniques, such as PECVD, HDP-CVD, SACVD, or PEALD.

As shown in FIG. 6J, the BSI oxide layer 644 may be planarized. In particular, a semiconductor processing tool (e.g., the planarization tool 110) may perform a planarization or polishing process such as chemical mechanical polishing/planarization (CMP). A CMP process may include depositing a slurry (or polishing compound) onto a polishing pad. A wafer including the image sensor 602 may be mounted to a carrier, which may rotate the wafer as the wafer is pressed against the polishing pad. The slurry and polishing pad act as an abrasive that polishes or planarizes the BSI oxide layer 644 as the wafer is rotated. The polishing pad may also be rotated to ensure a continuous supply of slurry is applied to the polishing pad.

As shown in FIG. 6K, an opening 646 (or trench) may be formed in the bonding pad region 606. In particular the opening 646 may be formed through the BSI oxide layer 644, through the metal shielding layer 638, through the oxide layer 632, through the ARC layer 630, and through the substrate 614 to the STI structure 618. The opening 646 may be formed by coating the BSI oxide layer 644 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the opening 646 (e.g., using the etching tool 108) based on the pattern in the photoresist.

As shown in FIG. 6L, a buffer oxide layer 648 may be formed over the BSI oxide layer 644 and over the STI structure 618 in the opening 646. In particular, a semiconductor processing tool (e.g., the deposition tool 102) may deposit an oxide material (e.g., a silicon oxide ($SiO_x$) or another type of oxide) such that the buffer oxide layer 648 is formed using various CVD techniques and/or atomic layer deposition (ALD) techniques, such as PECVD, HDP-CVD, SACVD, or PEALD.

As shown in FIG. 6M, openings 650 (or trenches) may be formed in the opening 646 of the bonding pad region 606. In particular, the openings 650 may be formed through the buffer oxide layer 648, through the STI structure 618, through the ILD layer 612, and to the bonding pad 616 in the IMD layer 610. The openings 650 may be formed by coating the buffer oxide layer 648 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the openings 650 (e.g., using the etching tool 108) based on the pattern in the photoresist.

As shown in FIG. 6N, a BSI pad 654 may be formed in the openings 650. For example, a semiconductor processing tool (e.g., the deposition tool 102 or the plating tool 112) may form a metal layer (e.g., an aluminum layer, a gold layer, a silver layer, a metal alloy layer, or another type of metal layer) on the buffer oxide layer 648, on the STI structure 618, and in the openings 650. Portions of the metal layer may be removed by coating the metal layer with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the portions (e.g., using the etching tool 108) based on the pattern in the photoresist to form the BSI pad 654.

As shown in FIG. 6O, a filter layer 658 is formed for the pixel sensors in the pixel array 200. The filter layer 658 may be formed over and/or on the buffer oxide layer 648. In some implementations, a semiconductor processing tool (e.g., the deposition tool 102) may deposit the filter layer 658 using a CVD technique, a PVD technique, an ALD technique, or another type of deposition technique.

The filter layer 658 may include an array of color filter regions 658a, which includes a color filter for each visible light pixel sensor 622 in the pixel array 200. In this way, the color filter region 658a for each visible light pixel sensor 622 filters the color of the visible light pixel sensor 622 by allowing a particular wavelength of the incident light to pass to a corresponding photodiode 620 of the visible light pixel sensor 622. For example, a first color filter region 658a may filter incident light for a first visible light pixel sensor 622, a second color filter region 658a may filter incident light (e.g., for the same wavelength range or a different wavelength range) for a second visible light pixel sensor 622, a third color filter region 658a may filter incident light (e.g., for the same wavelength range or a different wave length range as the first and/or second color filter regions) for a third visible light pixel sensor 622, and so on. A color filter region 658a may, for example, be a blue color filter region that permits the portion of incident light near a 450 nanometer wavelength to pass and blocks other wavelengths from passing. Another color filter region 658a may, for example, be a green color filter region that permits the portion of incident light near a 550 nanometer wavelength to pass and blocks other wavelengths from passing. Another color filter region 658a may, for example, be a red color filter region that permits the portion of incident light near a 650 nanometer wavelength to pass and blocks other wavelengths from passing.

The filter layer 658 may also include an array of NIR bandpass filters 658b for each of the NIR light pixel sensors 624 in the pixel array 200. An NIR bandpass filter 658b may allow the portion of incident light in an NIR wavelength range to pass while blocking visible light from passing.

As shown in FIG. 6P, a micro-lens layer 660 including a plurality of micro-lenses is formed over and/or on the filter layer 658. The micro-lens layer 660 may include a respective micro-lens for each of the pixel sensors included in the pixel array 200. For example, a first micro-lens may be formed to focus incident light toward the photodiode 620 of a first pixel sensor (e.g., a visible light pixel sensor 622 or an NIR light pixel sensor 624), a second micro-lens may be formed to focus incident light toward the photodiode 620 of a second pixel sensor (e.g., a visible light pixel sensor 622 or an NIR light pixel sensor 624), a third micro-lens may be formed to focus incident light toward the photodiode 620 of a third pixel sensor (e.g., a visible light pixel sensor 622 or an NIR light pixel sensor 624), and so on.

As indicated above, FIGS. 6A-6P are provided as an example. Other examples may differ from what is described with regard to FIGS. 6A-6P. The various layers and/or components of the image sensor 602 described above in connection with FIGS. 6A-6P may be arranged according to the examples described above and/or arranged according to other examples to achieve or satisfy one or more performance parameters and/or attributes, such as color saturation, noise, contrast, brightness, hue and saturation, light sensitivity, contour sharpness, image sensor size, pixel sensor density, and/or the like.

Figure 7:
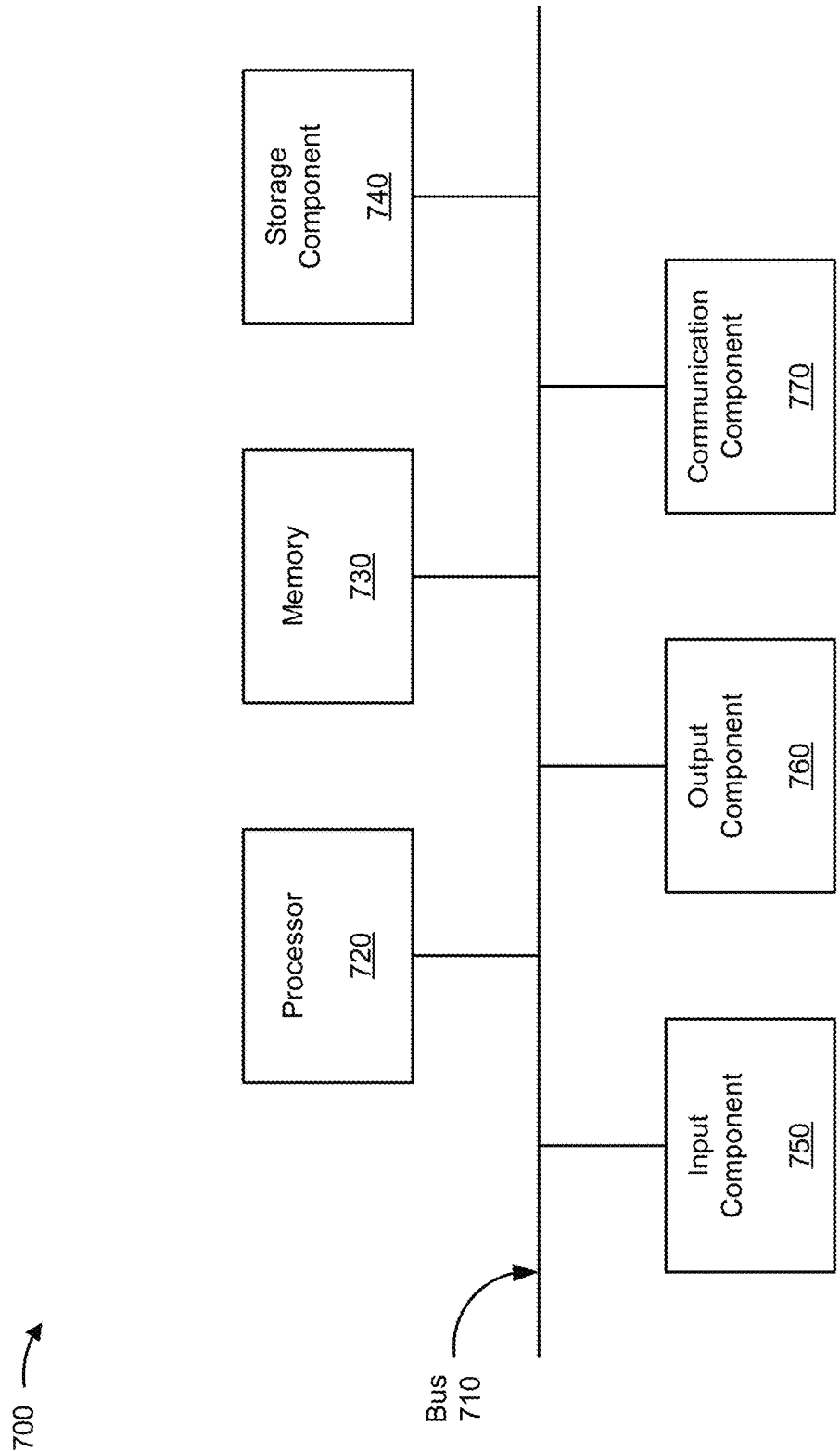
FIG. 7 is a diagram of example components of one or more devices of FIG. 1.

FIG. 7 is a diagram of example components of a device 700. In some implementations, one or more of the semiconductor processing tools 102-114 and/or wafer/die transport tool 116 may include one or more devices 700 and/or one or more components of device 700. As shown in FIG. 7, device 700 may include a bus 710, a processor 720, a memory 730, a storage component 740, an input component 750, an output component 760, and a communication component 770.

Bus 710 includes a component that enables wired and/or wireless communication among the components of device 700. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform a function. Memory 730 includes a random access memory, a read only memory, and/or another type of memory (e.g., a flash memory, a magnetic memory, and/or an optical memory).

Storage component 740 stores information and/or software related to the operation of device 700. For example, storage component 740 may include a hard disk drive, a magnetic disk drive, an optical disk drive, a solid state disk drive, a compact disc, a digital versatile disc, and/or another type of non-transitory computer-readable medium. Input component 750 enables device 700 to receive input, such as user input and/or sensed inputs. For example, input component 750 may include a touch screen, a keyboard, a keypad, a mouse, a button, a microphone, a switch, a sensor, a global positioning system component, an accelerometer, a gyroscope, an actuator, and/or the like. Output component 760 enables device 700 to provide output, such as via a display, a speaker, and/or one or more light-emitting diodes. Communication component 770 enables device 700 to communicate with other devices, such as via a wired connection and/or a wireless connection. For example, communication component 770 may include a receiver, a transmitter, a transceiver, a modem, a network interface card, an antenna, and/or the like.

Device 700 may perform one or more processes described herein. For example, a non-transitory computer-readable medium (e.g., memory 730 and/or storage component 740) may store a set of instructions (e.g., one or more instructions, code, software code, program code, and/or the like) for execution by processor 720. Processor 720 may execute the set of instructions to perform one or more processes described herein. In some implementations, execution of the set of instructions, by one or more processors 720, causes the one or more processors 720 and/or the device 700 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
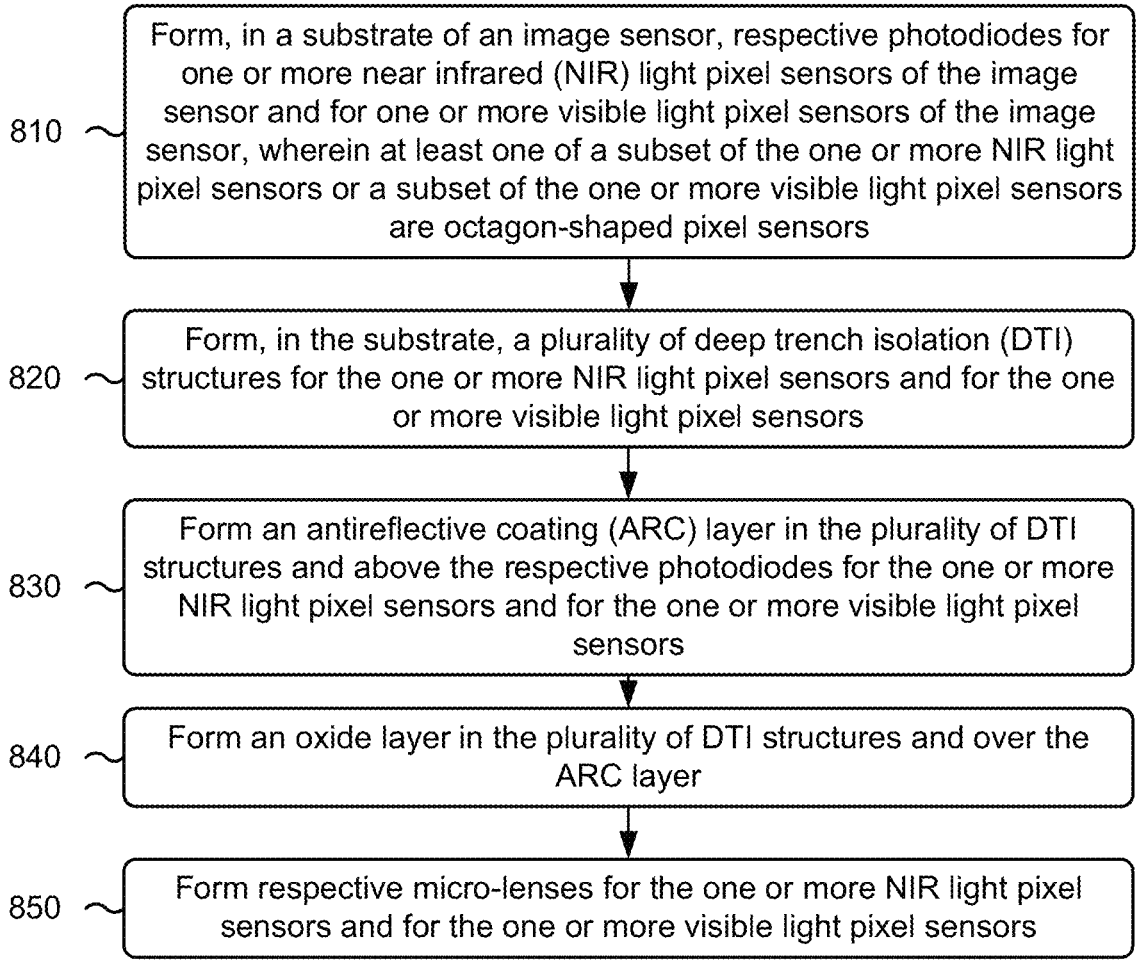
FIG. 8 is a flowchart of an example process relating to forming an image sensor described herein.

FIG. 8 is a flowchart of an example process 800 associated with forming a pixel array. In some implementations, one or more process blocks of FIG. 8 may be performed by one or more semiconductor processing tools (e.g., one or more of the semiconductor processing tools 102-114). Additionally, or alternatively, one or more process blocks of FIG. 8 may be performed by one or more components of device 700, such as processor 720, memory 730, storage component 740, input component 750, output component 760, and/or communication component 770.

As shown in FIG. 8, process 800 may include forming, in a substrate of an image sensor, respective photodiodes for one or more NIR light pixel sensors of the image sensor and for one or more visible light pixel sensors of the image sensor, where at least one of a subset of the one or more NIR light pixel sensors or a subset of the one or more visible light pixel sensors are octagon-shaped pixel sensors (block 810). For example, a semiconductor processing tool (e.g., the ion implantation tool 114) may form, in a substrate 614 of an image sensor 602, respective photodiodes 620 for one or more NIR light pixel sensors 624 of the image sensor 602 and for one or more visible light pixel sensors of 622 the image sensor 602, as described above. In some implementations, at least one of a subset of the one or more NIR light pixel sensors 624 or a subset of the one or more visible light pixel sensors 622 are octagon-shaped pixel sensors.

As further shown in FIG. 8, process 800 may include forming, in the substrate, a plurality of DTI structures for the one or more NIR light pixel sensors and for the one or more visible light pixel sensors (block 820). For example, one or more semiconductor processing tools (e.g., the deposition tool 102, the exposure tool 104, the developer tool 106, the etching tool 108, the planarization tool 110, and/or another semiconductor processing tool) may form, in the substrate, a plurality of DTI structures 626 for the one or more NIR light pixel sensors 624 and for the one or more visible light pixel sensors 622, as described above.

As further shown in FIG. 8, process 800 may include forming an ARC layer in the plurality of DTI structures and above the respective photodiodes for the one or more NIR light pixel sensors and for the one or more visible light pixel sensors (block 830). For example, a semiconductor processing tool (e.g., the deposition tool 102) may form an ARC layer 630 in the plurality of DTI structures 626 and above the respective photodiodes 620 for the one or more NIR pixel sensors 624 and for the one or more visible light pixel sensors 622, as described above.

As further shown in FIG. 8, process 800 may include forming an oxide layer in the plurality of DTI structures and over the ARC layer (block 840). For example, a semiconductor processing tool (e.g., the deposition tool 102) may form an oxide layer 632 in the plurality of DTI structures 626 and over the ARC layer 630, as described above.

As further shown in FIG. 8, process 800 may include forming respective micro-lenses for the one or more NIR light pixel sensors and for the one or more visible light pixel sensors (block 850). For example, a semiconductor processing tool (e.g., the deposition tool 102) may form respective micro-lenses 660 for the one or more NIR light pixel sensors 624 and for the one or more visible light pixel sensors 622, as described above.

Process 800 may include additional implementations, such as any single implementation or any combination of implementations described below and/or in connection with one or more other processes described elsewhere herein.

In a first implementation, process 800 includes forming a quantity of the one or more NIR light pixel sensors 624 of the image sensor 602 based on one or more performance parameters for the image sensor 602, and forming a quantity of the one or more visible light pixel sensors 622 of the image sensor 602 based on the one or more performance parameters for the image sensor. In a second implementation, alone or in combination with the first implementation, the one or more performance parameters comprise at least one of a color saturation parameter, a contour sharpness parameter, or a light sensitively parameter.

In a third implementation, alone or in combination with one or more of the first and second implementations, at least one of at least another subset of the one or more NIR light pixel sensors 624 are square-shaped pixel sensors, or at least another subset of the one or more visible light pixel sensors 622 are square-shaped pixel sensors. In a fourth implementation, alone or in combination with one or more of the first through third implementations, process 800 includes forming respective NIR bandpass filters 658b for each of the one or more NIR light pixel sensors 624, and forming respective visible light filters 658a for each of the one or more visible light pixel sensors 622.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, a pixel array includes octagon-shaped pixel sensors. Moreover, the pixel array may include a combination of visible light pixel sensors (e.g., red, green, and blue pixel sensors) to obtain color information from incident light and NIR pixel sensors to obtain an increased amount of luminance from the incident light relative to the visible light pixel sensors. The color information obtained by the visible light pixel sensors and the luminance obtained by the NIR pixel sensors may be combined to increase the low-light performance of the pixel array, and to allow for low-light color images in applications such as night-vision cameras, security surveillance cameras, automotive vision sensors, and hunting cameras. The octagon-shaped pixel sensors may be interspersed in the pixel array with square-shaped pixel sensors to increase the utilization of space in the pixel array, and to allow for pixel sensors in the pixel array to be sized differently. The capability to accommodate different sizes of visible light pixel sensors and NIR pixel sensors permits the pixel array to be formed and/or configured to satisfy various performance parameters, such as color saturation, noise, contrast, brightness, hue and saturation, light sensitivity, and contour sharpness.

As described in greater detail above, some implementations described herein provide a pixel array. The pixel array includes a plurality of octagon-shaped pixel sensors. The pixel array includes a plurality of square-shaped pixel sensors. Each square-shaped pixel sensor of at least a subset of the square-shaped pixel sensors is disposed between a respective subset of the plurality of octagon-shaped pixel sensors.

As described in greater detail above, some implementations described herein provide a pixel array. The pixel array includes a first plurality of octagon-shaped pixel sensors and a second plurality of octagon-shaped pixel sensors. An attribute for one or more of the first plurality of octagon-shaped pixel sensors and an attribute for one or more of the second plurality of octagon-shaped pixel sensors are different. The pixel array further includes a plurality of square-shaped pixel sensors. Each square-shaped pixel sensor of at least a subset of the square-shaped pixel sensors is disposed between at least one of a subset of the first plurality of octagon-shaped pixel sensors or a subset of the second plurality of octagon-shaped pixel sensors.

As described in greater detail above, some implementations described herein provide a method. The method includes forming, in a substrate of an image sensor, respective photodiodes for one or more NIR light pixel sensors of the image sensor and for one or more visible light pixel sensors of the image sensor. At least one of a subset of the one or more NIR light pixel sensors or a subset of the one or more visible light pixel sensors are octagon-shaped pixel sensors. The method includes forming, in the substrate, a plurality of DTI structures for the one or more NIR light pixel sensors and for the one or more visible light pixel sensors. The method includes forming an ARC layer in the plurality of DTI structures and above the respective photodiodes for the one or more NIR light pixel sensors and for the one or more visible light pixel sensors. The method includes forming an oxide layer in the plurality of DTI structures and over the ARC layer. The method includes forming respective micro-lenses for the one or more NIR light pixel sensors and for the one or more visible light pixel sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming, in a substrate of an image sensor, respective photodiodes for one or more near infrared (NIR) light pixel sensors of the image sensor and for one or more visible light pixel sensors of the image sensor;
   forming, in the substrate, a plurality of deep trench isolation (DTI) structures for the one or more NIR light pixel sensors and for the one or more visible light pixel sensors;
   forming a plurality of absorption regions comprising a first absorption region, in the substrate, and a second absorption region in at least one photodiode of the respective photodiodes;
   forming an oxide layer in the plurality of DTI structures and the plurality of absorption regions; and
   forming respective micro-lenses for the one or more NIR light pixel sensors and for the one or more visible light pixel sensors.

2. The method of claim 1, further comprising:
   forming a quantity of the one or more NIR light pixel sensors based on one or more performance parameters for the image sensor; and
   forming a quantity of the one or more visible light pixel sensors based on the one or more performance parameters for the image sensor.

3. The method of claim 2, wherein the one or more performance parameters comprise at least one of:
   a color saturation parameter,
   a contour sharpness parameter, or
   a light sensitivity parameter.

4. The method of claim 1, wherein at least one of:
   a subset of the one or more NIR light pixel sensors are square-shaped pixel sensors, or
   a subset of the one or more visible light pixel sensors are square-shaped pixel sensors.

5. The method of claim 1, further comprising:
   forming respective NIR bandpass filters for each of the one or more NIR light pixel sensors; and
   forming respective visible light filters for each of the one or more visible light pixel sensors.

6. A method, comprising:
   forming, in a substrate of an image sensor, respective photodiodes for one or more near infrared (NIR) light pixel sensors of the image sensor and for one or more visible light pixel sensors of the image sensor;
   forming, in the substrate, a plurality of deep trench isolation (DTI) structures for the one or more NIR light pixel sensors and for the one or more visible light pixel sensors;
   forming a plurality of absorption regions, in at least one of the substrate or at least one photodiode of the respective photodiodes, having a periodic or zig-zag structure;
   forming an antireflective coating (ARC) layer, in the plurality of DTI structures and the plurality of absorption regions and above the respective photodiodes, for the one or more NIR light pixel sensors and for the one or more visible light pixel sensors; and
   forming respective micro-lenses for the one or more NIR light pixel sensors and for the one or more visible light pixel sensors.

7. The method of claim 6, wherein forming the plurality of DTI structures comprises:
   forming, in the substrate, the plurality of DTI structures between the one or more NIR light pixel sensors and for the one or more visible light pixel sensors.

8. The method of claim 6, wherein the plurality of absorption regions comprises a first subset of absorption regions formed in the substrate and a second subset of absorption regions formed in the at least one photodiode of the respective photodiodes.

9. The method of claim 6, wherein the ARC layer includes a nitrogen-containing material.

10. The method of claim 6, further comprising:
    forming an oxide layer in the plurality of DTI structures, wherein forming the respective micro-lenses is based on forming the oxide layer.

11. The method of claim 10, further comprising:
forming a metal shielding layer over the oxide layer,
wherein forming the respective micro-lenses is based on forming the metal shielding layer.

12. The method of claim 11, further comprising:
forming openings through the metal shielding layer and in a portion of the oxide layer, wherein forming the respective micro-lenses is based on forming the openings.

13. The method of claim 12, wherein the openings reside over the respective photodiodes.

14. The method of claim 6, wherein each of the plurality of absorption regions is formed in the substrate or the at least one photodiode of the respective photodiodes.

15. A method, comprising:
forming, in a substrate of an image sensor, respective photodiodes for a plurality of near infrared (NIR) light pixel sensors of the image sensor and for a plurality of visible light pixel sensors of the image sensor,
wherein the plurality of NIR light pixel sensors are square-shaped sensors, and the plurality of visible light pixel sensors are octagon-shaped sensors, and
wherein at least one NIR light pixel sensor of the plurality of NIR light pixel sensors is disposed between at least one visible light pixel sensor of the plurality of visible light pixel sensors,
wherein a size ratio between a first subset of NIR light pixel sensors of the plurality of NIR light pixel sensors and a first subset of visible light pixel sensors of the plurality of visible light pixel sensors is different than a size ratio between a second subset of NIR light pixel sensors of the plurality of NIR light pixel sensors and a second subset of visible light pixel sensors of the plurality of visible light pixel sensors; and
forming respective micro-lenses for the plurality of NIR light pixel sensors and for the plurality of visible light pixel sensors.

16. The method of claim 15, further comprising:
forming, in the substrate, a plurality of deep trench isolation (DTI) structures for the plurality of NIR light pixel sensors and for the plurality of visible light pixel sensors,
wherein forming the respective micro-lenses is based on forming the plurality of DTI structures.

17. The method of claim 15, further comprising:
forming a quantity of the plurality of NIR light pixel sensors based on one or more performance parameters for the image sensor; and
forming a quantity of the plurality of visible light pixel sensors based on the one or more performance parameters for the image sensor.

18. The method of claim 15, further comprising:
forming respective NIR bandpass filters for each of the plurality of NIR light pixel sensors; and
forming respective visible light filters for each of the plurality of visible light pixel sensors.

19. The method of claim 15, further comprising:
forming, in the substrate, a plurality of deep trench isolation (DTI) structures for the plurality of NIR light pixel sensors and for the plurality of visible light pixel sensors,
wherein forming the respective micro-lenses is based on forming the DTI structures.

20. The method of claim 15, further comprising:
forming one or more absorption regions in at least one of the substrate or the respective photodiodes,
wherein forming the respective micro-lenses is based on forming the one or more absorption regions.

* * * * *